(12) United States Patent
Yamazaki et al.

(10) Patent No.: US 8,541,780 B2
(45) Date of Patent: Sep. 24, 2013

(54) SEMICONDUCTOR DEVICE HAVING OXIDE SEMICONDUCTOR LAYER

(75) Inventors: Shunpei Yamazaki, Tokyo (JP); Junichiro Sakata, Kanagawa (JP); Kosei Noda, Kanagawa (JP); Masayuki Sakakura, Tochigi (JP); Yoshiaki Oikawa, Kanagawa (JP); Hotaka Maruyama, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 72 days.

(21) Appl. No.: 12/872,823

(22) Filed: Aug. 31, 2010

(65) Prior Publication Data

US 2011/0057188 A1 Mar. 10, 2011

(30) Foreign Application Priority Data

Sep. 4, 2009 (JP) ................................. 2009-205222

(51) Int. Cl.
*H01L 29/12* (2006.01)
*H01L 29/786* (2006.01)

(52) U.S. Cl.
USPC ............. 257/43; 257/E29.068; 257/E29.132; 257/E29.273; 438/104

(58) Field of Classification Search
USPC ............. 257/43, E29.068, E29.132, E29.273; 438/104
See application file for complete search history.

(56) References Cited

U.S. PATENT DOCUMENTS

| | | | |
|---|---|---|---|
| 5,731,856 | A | 3/1998 | Kim et al. |
| 5,733,797 | A | 3/1998 | Yamaha |
| 5,744,864 | A | 4/1998 | Cillessen et al. |
| 5,786,638 | A | 7/1998 | Yamaha |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |

(Continued)

FOREIGN PATENT DOCUMENTS

| | | |
|---|---|---|
| EP | 1 737 044 A1 | 12/2006 |
| EP | 2 061 087 A2 | 5/2009 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184

(Continued)

*Primary Examiner* — Evan Pert
(74) *Attorney, Agent, or Firm* — Fish & Richardson P.C.

(57) ABSTRACT

It is an object to manufacture a highly reliable semiconductor device including a thin film transistor whose electric characteristics are stable. An insulating layer which covers an oxide semiconductor layer of the thin film transistor contains a boron element or an aluminum element. The insulating layer containing a boron element or an aluminum element is formed by a sputtering method using a silicon target or a silicon oxide target containing a boron element or an aluminum element. Alternatively, an insulating layer containing an antimony (Sb) element or a phosphorus (P) element instead of a boron element covers the oxide semiconductor layer of the thin film transistor.

20 Claims, 18 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,385,265 B2 * | 6/2008 | Manabe et al. ............... 257/410 |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,531,789 B2 | 5/2009 | Nakaya et al. |
| 7,674,650 B2 | 3/2010 | Akimoto et al. |
| 7,732,819 B2 | 6/2010 | Akimoto et al. |
| 7,767,505 B2 | 8/2010 | Son et al. |
| 8,129,717 B2 | 3/2012 | Yamazaki et al. |
| 8,319,214 B2 | 11/2012 | Imai |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0137103 A1 | 5/2009 | Yamazaki |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0123130 A1 | 5/2010 | Akimoto et al. |
| 2010/0155716 A1* | 6/2010 | Cheong et al. .................. 257/43 |
| 2010/0181575 A1* | 7/2010 | Makita et al. .................. 257/72 |
| 2010/0243994 A1* | 9/2010 | Yoon et al. ..................... 257/40 |
| 2011/0115763 A1 | 5/2011 | Yamazaki et al. |
| 2012/0108006 A1 | 5/2012 | Yamazaki et al. |
| 2012/0108007 A1 | 5/2012 | Yamazaki et al. |

FOREIGN PATENT DOCUMENTS

| | | |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-188239 A | 7/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-326069 A | 11/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2007-115808 A | 5/2007 |
| JP | 2007-123861 A | 5/2007 |
| JP | 2007-165861 A | 6/2007 |
| JP | 2008-281988 A | 11/2008 |
| JP | 2009-130229 A | 6/2009 |
| JP | 2009-141341 A | 6/2009 |
| KR | 2009-050971 A | 5/2009 |
| KR | 2010-014164 A | 2/2010 |
| WO | 2004/114391 A1 | 12/2004 |
| WO | 2008/126879 A1 | 10/2008 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above—Threshold Characteristics of Polysilicon Thin-Film Transistors," IEEE Transactions on Electron Devices, Jul. 1, 1995, vol. 42, pp. 1240-1246.

Cho, D et al., "21.1: AL and SN-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letter, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214TH ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13TH International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn TFTS with a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report, PCT Application No. PCT/JP2010/064652, dated Nov. 16, 2010, 3 pages.

Written Opinion, PCT Application No. PCT/JP2010/064652, dated Nov. 16, 2010, 5 pages.

* cited by examiner

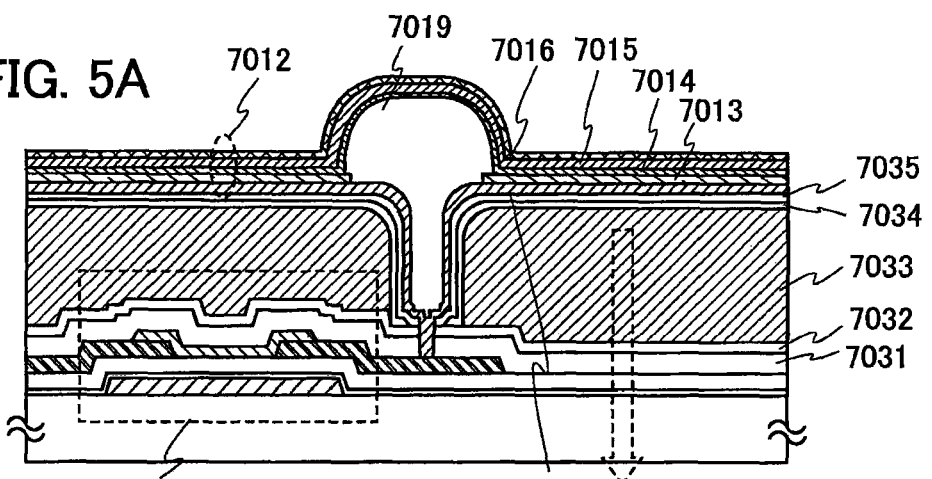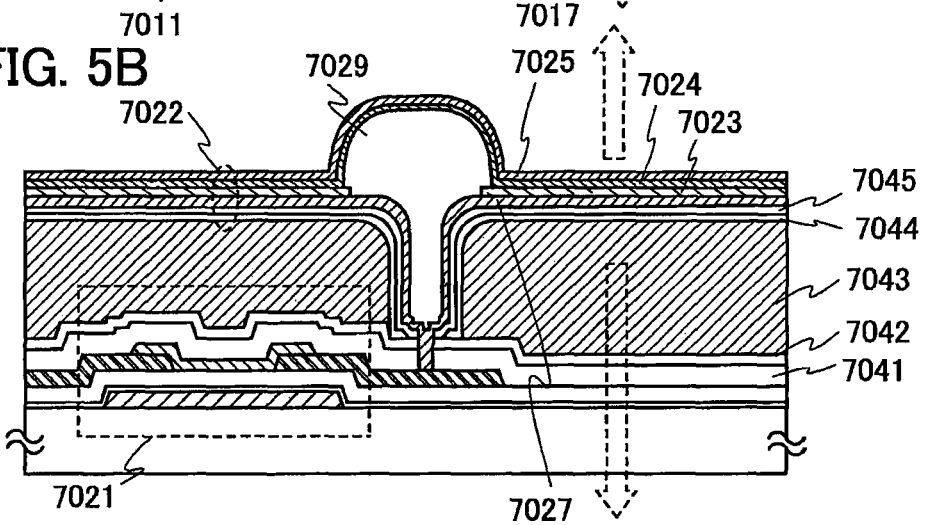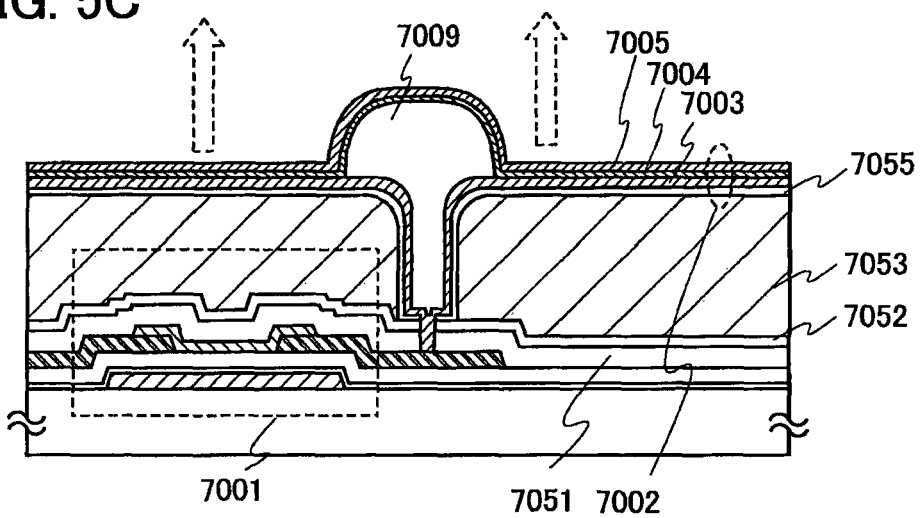

SEMICONDUCTOR DEVICE HAVING OXIDE SEMICONDUCTOR LAYER

TECHNICAL FIELD

The present invention relates to a semiconductor device including an oxide semiconductor and a manufacturing method thereof.

In this specification, a semiconductor device generally means a device which can function by utilizing semiconductor characteristics, and an electro-optical device, a semiconductor circuit, and an electronic device are all semiconductor devices.

BACKGROUND ART

In recent years, a technique for forming a thin film transistor (TFT) by using a semiconductor thin film (having a thickness of approximately several nanometers to several hundred nanometers) formed over a substrate having an insulating surface has attracted attention. Thin film transistors are applied to a wide range of electronic devices such as ICs or electro-optical devices, and prompt development of thin film transistors that are to be used as switching elements in image display devices, in particular, is being pushed. Various metal oxides are used for a variety of applications.

Some metal oxides have semiconductor characteristics. Examples of such metal oxides having semiconductor characteristics include tungsten oxide, tin oxide, indium oxide, and zinc oxide. Thin film transistors in which channel formation regions are formed of such metal oxides having semiconductor characteristics are known (Patent Documents 1 and 2).
[Reference]
[Patent Document]
[Patent Document 1]
  Japanese Published Patent Application No. 2007-123861
[Patent Document 2]
  Japanese Published Patent Application No. 2007-096055

DISCLOSURE OF INVENTION

It is an object to manufacture a highly reliable semiconductor device including a thin film transistor whose electric characteristics are stable.

In a thin film transistor, an insulating layer which covers an oxide semiconductor layer is made to contain a boron element or an aluminum element. The insulating layer containing a boron element or an aluminum element is formed by a sputtering method using a silicon target or a silicon oxide target containing a boron element or an aluminum element.

The concentration of boron in the insulating layer containing a boron element is $1 \times 10^{18}$ cm$^{-3}$ to $1 \times 10^{22}$ cm$^{-3}$ inclusive, preferably $1 \times 10^{20}$ cm$^{-3}$ to $5 \times 10^{20}$ cm$^{-3}$ inclusive. In addition, the concentration of aluminum in the insulating layer containing an aluminum element is $3 \times 10^{19}$ cm$^{-3}$ to $1 \times 10^{22}$ cm$^{-3}$ inclusive, preferably $1 \times 10^{20}$ cm$^{-3}$ to $5 \times 10^{20}$ cm$^{-3}$ inclusive.

Such a concentration range can be obtained by secondary ion mass spectrometry (SIMS) or on the basis of data of SIMS.

Before the insulating layer containing a boron element or an aluminum element is formed, plasma treatment using a gas such as $N_2O$, $N_2$, or Ar is performed. The plasma treatment using a gas such as $N_2O$, $N_2$, or Ar removes adsorbed water or hydrogen on the oxide semiconductor layer and reduces moisture or the like entering an interface between the oxide semiconductor layer and the insulating layer containing a boron element or an aluminum element.

Alternatively, an insulating layer containing an antimony (Sb) element or a phosphorus (P) element instead of a boron element may cover the oxide semiconductor layer of the thin film transistor. Further alternatively, an insulating layer containing a plurality of elements selected from a boron element, an antimony element, an aluminum element, and a phosphorus element, for example, an insulating layer containing both a boron element and a phosphorus element may cover the oxide semiconductor layer of the thin film transistor. The concentration of antimony in the insulating layer containing an antimony (Sb) element is $1 \times 10^{19}$ cm$^{-3}$ to $3 \times 10^{21}$ cm$^{-3}$ inclusive. The concentration of phosphorus in the insulating layer containing a phosphorus (P) element is $1 \times 10^{19}$ cm$^{-3}$ to $3 \times 10^{21}$ cm$^{-3}$ inclusive.

An insulating layer formed of silicon oxide which contains a boron element, an antimony element, an aluminum element, or a phosphorus element is more likely to be vitrified, compared to an insulating layer formed of silicon oxide which does not contain any of the above elements. Therefore, water is not adsorbed easily under the humid condition from room temperature to 150° C., and moisture, hydrogen, or the like can be prevented from entering the interface between the oxide semiconductor layer and the insulating layer. Note that in this specification, vitrification means hardening of silicon oxide without crystallization.

In addition, the oxide semiconductor layer of the thin film transistor may be sandwiched between the insulating layers each formed of silicon oxide containing a boron element, an antimony element, an aluminum element, or a phosphorus element, whereby entry of water or the like is prevented so as to improve the reliability of the thin film transistor. When the insulating layer containing a boron element, an antimony element, an aluminum element, or a phosphorus element is placed below the oxide semiconductor layer, one of or both a base insulating layer in contact with a substrate and a gate insulating layer covering a gate electrode layer is/are used as this insulating layer.

Further, a single insulating layer deposited by changing deposition conditions of a sputtering method or insulating layers stacked by changing deposition conditions of a sputtering method may be used. For example, an insulating layer formed of silicon oxide in which the concentration of a boron element has a gradient may be used. In addition, a two-layer structure of an insulating layer formed of silicon oxide which contains a boron element and an insulating layer formed of silicon oxide which does not contain a boron element may be employed. Furthermore, a layered structure including three or more layers may be employed in which an insulating layer formed of silicon oxide which contains a boron element and an insulating layer formed of silicon oxide which does not contain a boron element are repeatedly arranged.

According to an embodiment of the present invention disclosed in this specification, a semiconductor device includes a first insulating layer over a substrate, an oxide semiconductor layer over the first insulating layer, and a second insulating layer over the oxide semiconductor layer. The first insulating layer and the second insulating layer each contain a boron element or an aluminum element at $1 \times 10^{18}$ cm$^{-3}$ to $1 \times 10^{22}$ cm$^{-3}$ inclusive.

In addition, according to another embodiment of the present invention, a semiconductor device includes a first insulating layer over a substrate, an oxide semiconductor layer over the first insulating layer, and a second insulating layer over the oxide semiconductor layer. The first insulating layer and the second insulating layer each contain a phosphorus element or an antimony element at $1 \times 10^{19}$ cm$^{-3}$ to $3 \times 10^{21}$ cm$^{-3}$ inclusive.

In each of the above structures, the second insulating layer is in contact with the oxide semiconductor layer.

In addition, in each of the above structures, the semiconductor device further includes a third insulating layer formed of silicon oxide between the second insulating layer and the oxide semiconductor layer, and the third insulating layer does not contain a boron element, an aluminum element, a phosphorus element, or an antimony element.

With the above structures, at least one of the objects can be achieved.

In order to achieve the above structure, according to another embodiment of the present invention, a method for manufacturing a semiconductor device includes the steps of: forming a gate electrode layer over a substrate; forming an oxide semiconductor layer over the gate electrode layer; subjecting the oxide semiconductor layer to dehydration or dehydrogenation, wherein water or hydrogen is prevented from entering the oxide semiconductor layer without exposure to the air after the dehydration or the dehydrogenation; subjecting the oxide semiconductor layer to plasma treatment using $N_2O$, $N_2$, or Ar; and forming an insulating layer in contact with at least part of the oxide semiconductor layer after the plasma treatment.

The above manufacturing method further includes the step of forming a second insulating layer containing a boron element, an aluminum element, a phosphorus element, or an antimony element over the insulating layer by a sputtering method. With the second insulating layer which contains a boron element, an aluminum element, a phosphorus element, or an antimony element, water is not adsorbed easily under the humid condition from room temperature to 150° C., and moisture, hydrogen, or the like can be prevented from entering the interface with the oxide semiconductor layer.

According to another embodiment of the present invention, a method for manufacturing a semiconductor device includes the steps of: forming a gate electrode layer over a substrate; forming a first insulating layer over the gate electrode layer by a sputtering method; forming an oxide semiconductor layer over the first insulating layer; subjecting the oxide semiconductor layer to dehydration or dehydrogenation, wherein water or hydrogen is prevented from entering the oxide semiconductor layer without exposure to the air after the dehydration or the dehydrogenation; subjecting the oxide semiconductor layer to plasma treatment using $N_2O$, $N_2$, or Ar; and forming a second insulating layer over the oxide semiconductor layer by a sputtering method. The first insulating layer and the second insulating layer are each formed by a sputtering method using a silicon target and each contain a boron element, an aluminum element, a phosphorus element, or an antimony element.

The above manufacturing method further includes the step of forming a third insulating layer in contact with at least part of the oxide semiconductor layer after the plasma treatment, and the third insulating layer is formed of silicon oxide by a sputtering method using a silicon target. Note that in the third insulating layer, the concentration of each of a boron element, an aluminum element, a phosphorus element, and an antimony element is lower than that in the first and second insulating layers, or the concentrations of these elements are set to be less than the lower limit of measurement.

The oxide semiconductor layer is a thin film of $InMO_3(ZnO)_m$ (m>0). This thin film is used as the oxide semiconductor layer to fabricate the thin film transistor. Note that M denotes one metal element or a plurality of metal elements selected from Ga, Fe, Ni, Mn, and Co. For example, M may be Ga or may include the above metal element in addition to Ga, for example, M may be Ga and Ni or Ga and Fe. Moreover, in the above oxide semiconductor, in some cases, a transition metal element such as Fe or Ni or an oxide of the transition metal is contained as an impurity element in addition to a metal element contained as M. In this specification, as for the oxide semiconductor layers whose composition formulas are represented by $InMO_3(ZnO)_m$ (m>0), an oxide semiconductor which includes Ga as M is referred to as an In—Ga—Zn—O-based oxide semiconductor, and a thin film thereof is referred to as an In—Ga—Zn—O-based film.

As a metal oxide applied to the oxide semiconductor layer, any of the following metal oxides can be used besides the above: an In—Sn—O based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. Silicon oxide may be contained in the oxide semiconductor layer formed using any of the above metal oxides.

Dehydration or dehydrogenation is heat treatment which is performed in an atmosphere of an inert gas such as nitrogen or a rare gas (such as argon or helium) at a temperature greater than or equal to 400° C. and less than or equal to 750° C., preferably greater than or equal to 425° C. and less than the strain point of the substrate, with which an impurity such as moisture contained in the oxide semiconductor layer is reduced.

Further, a heating method using an electric furnace, a rapid heating method such as a gas rapid thermal annealing (GRTA) method using a heated gas or a lamp rapid thermal annealing (LRTA) method using lamp light, or the like can be used for the heat treatment for dehydration or dehydrogenation.

The above heat treatment is performed under such a condition that two peaks of water or at least one peak of water at around 300° C. is not detected even if TDS is performed at up to 450° C. on the oxide semiconductor layer subjected to dehydration or dehydrogenation. Therefore, even when TDS is performed at up to 450° C. on a thin film transistor using the dehydrated or dehydrogenated oxide semiconductor layer, at least a peak of water at around 300° C. is not detected.

In addition, when the temperature is lowered from a heating temperature T at which dehydration or dehydrogenation is performed on the oxide semiconductor layer, it is important to prevent entry of water or hydrogen by keeping the substrate in the furnace that has been used for the dehydration or dehydrogenation so that the oxide semiconductor layer is not exposed to the air. By performing dehydration or dehydrogenation, the oxide semiconductor layer is changed into an n-type (e.g., $n^-$-type or $n^+$-type) oxide semiconductor layer, i.e., a lower-resistance oxide semiconductor layer, and then, the n-type oxide semiconductor layer is changed into an i-type semiconductor layer to be a higher-resistance oxide semiconductor layer. When a thin film transistor is formed using such an oxide semiconductor layer, the threshold voltage of the thin film transistor can be positive, so that a so-called normally-off switching element can be realized. It is preferable in a display device that a channel be formed with a positive threshold voltage which is as close to 0 V as possible in a thin film transistor. If the threshold voltage of the thin film transistor is negative, it tends to be normally on; in other words, current flows between a source electrode and a drain electrode even when the gate voltage is 0 V. In an active-matrix display device, electric characteristics of thin film transistors included in a circuit are important and performance of the display device is dependent on the electric characteristics of the thin film transistors. Among the electric characteristics of the thin film transistors, in particular, a threshold voltage (Vth) is important. When the threshold voltage value is high or negative even when the field effect mobility is high, it is difficult to control the circuit. When the thin film transistor has a high threshold voltage and a large absolute value of its threshold voltage, the thin film transistor cannot perform a switching function as a TFT when the thin film transistor is driven at low voltage and may be a load. In the case of an n-channel thin film transistor, it is preferable that a channel be formed and drain current begins to flow after the positive voltage is applied as a gate voltage. A transistor in which a channel is not formed unless the driving voltage is increased and a transistor in which a channel is formed and drain current flows even in the case of the negative voltage state are unsuitable for a thin film transistor used in a circuit.

In this specification, heat treatment which is performed in an atmosphere of an inert gas such as nitrogen or a rare gas (such as argon or helium) is referred to as heat treatment for dehydration or dehydrogenation. In this specification, "dehydrogenation" does not indicate only elimination of $H_2$ by the heat treatment. For convenience, elimination of H, OH, or the like is also referred to as "dehydration or dehydrogenation".

In addition, a thin film transistor including an oxide semiconductor layer can be used for an electronic device or an optical device. For example, a thin film transistor including an oxide semiconductor layer can be used for a switching element of a liquid crystal display device, a switching element of a light-emitting device, a switching element of an electronic paper, and the like.

In addition, without limitation to a display device, an insulated-gate semiconductor device for controlling a large amount of electric power, in particular, a semiconductor device called a power MOS device can be manufactured with the use of a thin film transistor including an oxide semiconductor layer. Examples of the power MOS device include a MOSFET and an IGBT.

An insulating layer formed of silicon oxide containing a boron element, an antimony element, an aluminum element, or a phosphorus element is provided above or below an oxide semiconductor layer of a thin film transistor, whereby entry of water or the like is prevented so as to improve the reliability of the thin film transistor.

BRIEF DESCRIPTION OF DRAWINGS

FIGS. 5A to 5C are cross-sectional views each illustrating a display device according to an embodiment of the present invention.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details thereof can be modified in various ways. Therefore, the present invention is not construed as being limited to the description of the embodiments below.

(Embodiment 1)

Figure 1A:
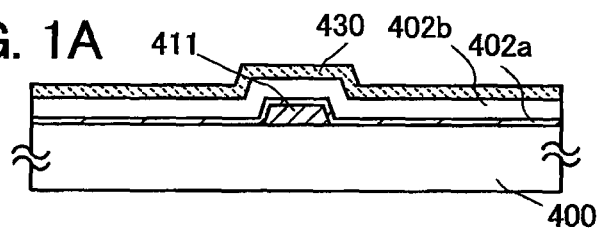
FIGS. 1A to 1D are cross-sectional views illustrating an embodiment of the present invention.
Figure 1B:
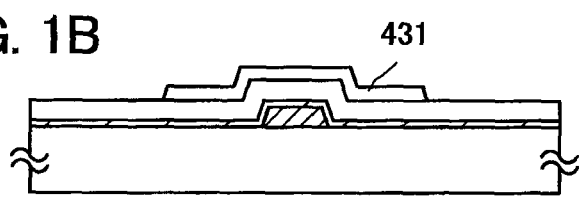
Figure 1C:
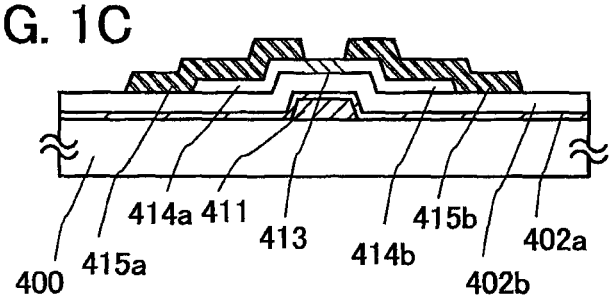
Figure 1D:
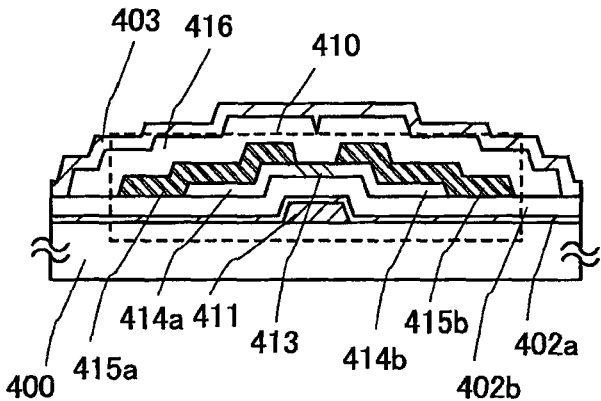

FIG. 1D illustrates an example of a cross-sectional structure of a thin film transistor formed over a substrate, which is one kind of bottom gate thin film transistor.

A thin film transistor 410 illustrated in FIG. 1D is a channel-etched thin film transistor and includes, over a substrate 400 having an insulating surface, a gate electrode layer 411; a first gate insulating layer 402a; a second gate insulating layer 402b; an oxide semiconductor layer including at least a channel formation region 413, a high-resistance source region 414a, and a high-resistance drain region 414b; a source electrode layer 415a; and a drain electrode layer 415b. Moreover, an oxide insulating layer 416 which covers the thin film transistor 410 and is in contact with the channel formation region 413 is provided, and a protective insulating layer 403 is provided over the oxide insulating layer 416.

As the protective insulating layer 403, an insulating layer formed of silicon oxide which contains a boron element, an antimony element, an aluminum element, or a phosphorus element by a sputtering method is used. The protective insulating layer formed of silicon oxide which contains a boron element, an antimony element, an aluminum element, or a phosphorus element is more likely to be vitrified, compared to an insulating layer formed of silicon oxide which does not contain any of the above elements. Therefore, water is not adsorbed easily under the humid condition from room temperature to 150° C., and moisture, hydrogen, or the like can be prevented from entering the interface with the oxide semiconductor layer.

Further, the first gate insulating layer 402a may be formed using an insulating layer formed of silicon oxide which contains a boron element, an antimony element, an aluminum element, or a phosphorus element by a sputtering method so that the oxide semiconductor layer of the thin film transistor may be sandwiched between the insulating layers each formed of silicon oxide containing a boron element, an antimony element, an aluminum element, or a phosphorus element, whereby entry of water or the like can be prevented so as to improve the reliability of the thin film transistor.

The thin film transistor 410 is described using a single-gate thin film transistor; a multi-gate thin film transistor including a plurality of channel formation regions can be formed when needed.

A process for forming the thin film transistor 410 over the substrate is described below with reference to FIGS. 1A to 1D.

First, a conductive film is formed over the substrate 400 having an insulating surface, and then, the gate electrode layer 411 is formed through a first photolithography step. Note that a resist mask may be formed by an ink-jet method. A photomask is not used when the resist mask is formed by an ink-jet method, which results in reducing manufacturing costs.

Although there is no particular limitation on a substrate which can be used as the substrate 400 having an insulating surface, it is necessary that the substrate have at least a heat resistance high enough to resist heat treatment to be performed later. As the substrate 400 having an insulating surface, a glass substrate formed of barium borosilicate glass, aluminoborosilicate glass, or the like can be used.

In the case where the temperature of the heat treatment to be performed later is high, a glass substrate whose strain point is greater than or equal to 730° C. is preferably used. As the glass substrate, a substrate of a glass material such as aluminosilicate glass, aluminoborosilicate glass, or barium borosilicate glass is used, for example. Note that by containing a larger amount of barium oxide (BaO) than boric acid, a glass substrate that is heat-resistant and of more practical use can be obtained. Therefore, a glass substrate containing BaO and $B_2O_3$ so that the amount of BaO is larger than that of $B_2O_3$ is preferably used.

Note that a substrate formed of an insulator such as a ceramic substrate, a quartz substrate, or a sapphire substrate may be used instead of the above glass substrate. Alternatively, crystallized glass or the like can be used.

As the material of the gate electrode layer 411, there are an element selected from Al, Cr, Cu, Ta, Ti, Mo, and W, an alloy containing any of the above elements as a component, an alloy containing any of the above elements in combination, and the like.

Next, a gate insulating layer is formed over the gate electrode layer 411.

The gate insulating layer can be formed with a single layer or stacked layers using one or more of a silicon oxide layer, a silicon nitride layer, a silicon oxynitride layer, and a silicon nitride oxide layer by a plasma CVD method, a sputtering method, or the like. For example, a silicon oxynitride layer may be formed using $SiH_4$, oxygen, and nitrogen as a deposition gas by a plasma CVD method.

In this embodiment, the gate insulating layer is a stack of the first gate insulating layer 402a with a thickness of 50 nm to 200 nm inclusive and the second gate insulating layer 402b with a thickness of 50 nm to 300 nm inclusive. As the first gate insulating layer 402a, a silicon oxide film with a thickness of 100 nm is formed by deposition in an oxygen atmosphere using a sputtering method in which a columnar-like polycrystalline silicon target containing a boron element (resistivity: 1 Ωcm to 10 Ωcm) is used. The silicon oxide film used as the first gate insulating layer 402a contains a boron element. Without limitation to a boron element, an aluminum element, a phosphorus element, or an antimony element may be used.

Further, for the second gate insulating layer 402b, a 100-nm-thick silicon oxide film is formed by a PCVD method.

Further, an insulating film serving as a base film may be provided between the substrate 400 and the gate electrode layer 411. The base film has a function of preventing diffusion of an impurity element from the substrate 400, and can be formed to have a single-layer structure or a layered structure using one or more of a silicon nitride film, a silicon oxide film, a silicon nitride oxide film, and a silicon oxynitride film. In addition, a silicon oxide film obtained by being deposited in an oxygen atmosphere using a sputtering method in which a silicon target containing a boron element is used may be formed as the base film.

An oxide semiconductor film 430 with a thickness of 2 nm to 200 nm inclusive is formed over the second gate insulating layer 402b. The oxide semiconductor film 430 preferably has a small thickness of less than or equal to 50 nm so as to remain in an amorphous state even when heat treatment for dehydration or dehydrogenation is performed after the oxide semiconductor film 430 is formed. Small thickness of the oxide semiconductor film can prevent the oxide semiconductor layer from being crystallized when heat treatment is performed after the formation of the oxide semiconductor layer.

Note that before the oxide semiconductor film 430 is formed by a sputtering method, dust attached to a surface of the second gate insulating layer 402b is preferably removed by reverse sputtering in which plasma is generated by introduction of an argon gas. The reverse sputtering refers to a method in which, without application of a voltage to a target side, an RF power source is used for application of a voltage to a substrate side in an argon atmosphere to generate plasma in the vicinity of the substrate and modify a surface. Note that instead of an argon atmosphere, nitrogen, helium, oxygen, or the like may be used.

In this embodiment, the oxide semiconductor film 430 is formed by a sputtering method with the use of an In—Ga—Zn—O-based oxide semiconductor deposition target. FIG. 1A is a cross-sectional view of this stage. In addition, the oxide semiconductor film 430 can be formed by a sputtering method in a rare gas (typically, argon) atmosphere, an oxygen atmosphere, or an atmosphere containing a rare gas (typically, argon) and oxygen. When a sputtering method is employed, it is preferable that deposition be performed using a target containing $SiO_2$ of 2 wt % to 10 wt % inclusive and SiOx (x>0) which inhibits crystallization be contained in the oxide semiconductor film 430 so as to prevent crystallization at the time of the heat treatment for dehydration or dehydrogenation in a later step.

Then, the oxide semiconductor film 430 is processed into an island-like oxide semiconductor layer through a second photolithography step. A resist mask for forming the island-like oxide semiconductor layer may be formed by an ink-jet method. A photomask is not used when the resist mask is formed by an ink-jet method, which results in reducing manufacturing costs.

Then, the oxide semiconductor layer is subjected to dehydration or dehydrogenation. The temperature of first heat treatment for dehydration or dehydrogenation is greater than or equal to 400° C. and less than or equal to 750° C., preferably greater than or equal to 400° C. and less than the strain point of the substrate. Here, the substrate is put in an electric furnace which is a kind of heat treatment apparatus and heat treatment is performed on the oxide semiconductor layer at 450° C. for one hour in a nitrogen atmosphere, and then, water or hydrogen is prevented from entering the oxide semiconductor layer without exposure to the air; thus, an oxide semiconductor layer 431 is obtained (see FIG. 1B).

The heat treatment apparatus is not limited to an electric furnace and may be provided with a device that heats an object to be processed by thermal conduction or thermal radiation from a heater such as a resistance heater or the like. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment by using a high-temperature gas. As the gas, an inert gas which does not react with an object to be processed by heat treatment, like nitrogen or a rare gas such as argon is used.

For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment for a short time.

Note that in the first heat treatment, it is preferable that water, hydrogen, or the like be not contained in an atmosphere of nitrogen or a rare gas such as helium, neon, or argon. Alternatively, it is preferable that nitrogen or a rare gas such as helium, neon, or argon introduced into the heat treatment apparatus have a purity of greater than or equal to 6N (99.9999%), preferably greater than or equal to 7N (99.99999%); that is, the impurity concentration be set to less than or equal to 1 ppm, preferably less than or equal to 0.1 ppm.

In accordance with conditions of the first heat treatment or a material of the oxide semiconductor layer, the oxide semiconductor layer may be crystallized and changed to a microcrystalline film or a polycrystalline film. For example, the oxide semiconductor layer may be crystallized to be a microcrystalline oxide semiconductor film in which the degree of crystallization is greater than or equal to 90% or greater than or equal to 80%. Further, in accordance with conditions of the first heat treatment or a material of the oxide semiconductor layer, the oxide semiconductor layer may be an amorphous oxide semiconductor film which does not contain crystalline components.

The first heat treatment of the oxide semiconductor layer may be performed on the oxide semiconductor film 430 before being processed into the island-like oxide semiconductor layer. In that case, after the first heat treatment, the substrate is taken out of the heat treatment apparatus and a photolithography step is performed.

Next, a metal conductive film is formed over the second gate insulating layer 402b and the oxide semiconductor layer 431, and then, a resist mask is formed through a third photolithography step and the metal conductive film is selectively etched to form an island-like metal electrode layer. Examples of the material for the metal conductive film include an element selected from Al, Cr, Cu, Ta, Ti, Mo, and W; an alloy containing any of these elements as a component; and an alloy containing any of these elements in combination.

The metal conductive film preferably has a three-layer structure in which an aluminum layer is stacked over a titanium layer and a titanium layer is stacked over the aluminum layer, or a three-layer structure in which an aluminum layer is stacked over a molybdenum layer and a molybdenum layer is stacked over the aluminum layer. Needless to say, the metal conductive film may have a single-layer structure or a layered structure of two or more layers.

Then, the resist mask is removed, another resist mask is formed through a fourth photolithography step, and etching is performed selectively to form the source electrode layer 415a and the drain electrode layer 415b; after that, the resist mask is removed (see FIG. 1C). Note that in the fourth photolithography step, in some cases, only part of the oxide semiconductor layer 431 is etched, whereby an oxide semiconductor layer having a groove (a depression portion) is formed. In addition, the resist mask for forming the source electrode layer 415a and the drain electrode layer 415b may be formed by an ink-jet method. A photomask is not used when the resist mask is formed by an ink-jet method, which results in reducing manufacturing costs.

In order to reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed by using a multi-tone mask. Thus, the number of light-exposure masks can be reduced and the number of corresponding photolithography steps can also be reduced, whereby simplification of a process can be realized.

Then, plasma treatment using a gas such as $N_2O$, $N_2$, or Ar is performed. This plasma treatment removes water or the like adsorbed on a surface of the oxide semiconductor layer which is exposed. In addition, plasma treatment may be performed using a mixed gas of oxygen and argon.

After the plasma treatment, the oxide insulating layer 416 which serves as a protective insulating film and is in contact with part of the oxide semiconductor layer is formed without exposure to the air.

The oxide insulating layer 416 has a thickness of at least 1 nm and can be formed by a method by which an impurity such as water or hydrogen does not enter the oxide insulating layer 416, such as a sputtering method, as appropriate. In this embodiment, a 200-nm-thick silicon oxide film is deposited as the oxide insulating layer 416 by a sputtering method. The substrate temperature in film formation may be room temperature to 300° C. inclusive and is 100° C. in this embodiment. The silicon oxide film can be formed by a sputtering method in a rare gas (typically argon) atmosphere, an oxygen atmosphere, or an atmosphere containing a rare gas (typically argon) and oxygen. Further, a silicon oxide target or a silicon target can be used as a target. For example, the silicon oxide film can be formed by a sputtering method using a silicon target in an atmosphere containing oxygen and nitrogen. The oxide insulating layer 416 is formed in contact with the oxide semiconductor layer which has been an oxygen-deficient oxide semiconductor layer at the same time as the heat treatment for dehydration or dehydrogenation and become an n-type (lower-resistance) oxide semiconductor layer. As this oxide insulating layer 416, an inorganic insulating film which does not contain an impurity such as moisture, a hydrogen ion, or $OH^-$ and blocks entry of such an impurity from the outside is used. Specifically, a silicon oxide film, a silicon nitride oxide film, an aluminum oxide film, or an aluminum oxynitride film is used.

Next, second heat treatment (preferably at 200° C. to 400° C. inclusive, for example, 250° C. to 350° C. inclusive) is performed in an inert gas atmosphere or an oxygen gas atmosphere. For example, the second heat treatment is performed at 250° C. for one hour in a nitrogen atmosphere. When the second heat treatment is performed, heat is applied while part of the oxide semiconductor layer (a channel formation region) is in contact with the oxide insulating layer 416.

Through the above steps, the oxide semiconductor film after being deposited becomes the oxygen-deficient oxide semiconductor film to be the n-type (lower-resistance) oxide semiconductor film at the same time as the heat treatment for dehydration or dehydrogenation, and then, part of the oxide semiconductor film is selectively made to be in an oxygen excess state. As a result, the channel formation region 413 overlapping with the gate electrode layer 411 becomes i-type, and the high-resistance source region 414a overlapping with the source electrode layer 415a and the high-resistance drain region 414b overlapping with the drain electrode layer 415b are formed in a self-aligned manner. Though the above-described steps, the thin film transistor 410 is formed.

The high-resistance drain region 414b (or the high-resistance source region 414a) is formed in a portion of the oxide semiconductor layer which overlaps with the drain electrode layer 415b (or the source electrode layer 415a), so that the reliability of the thin film transistor can be increased. Specifically, with the formation of the high-resistance drain region 414b, the conductivity can be gradually varied from the drain electrode layer 415b to the high-resistance drain region 414b and the channel formation region 413. Thus, in the case where the transistor is operated with the drain electrode layer 415b connected to a wiring for supplying a high power supply potential VDD, the high-resistance drain region 414b serves as a buffer, and thus, local concentration of an electric field is not easily caused even when a high voltage is applied between the gate electrode layer 411 and the drain electrode layer 415b, which leads to an increase in the withstand voltage of the transistor.

Next, a resist mask is formed through a fifth photolithography step and etching is selectively performed, so that part of the oxide insulating layer 416 is removed and part of the second gate insulating layer 402b is exposed.

Next, the protective insulating layer 403 is formed over the oxide insulating layer 416. The protective insulating layer 403 is provided to be in contact with the region of the second gate insulating layer 402b which is exposed. The protective insulating layer 403 is formed using an insulating layer formed of silicon oxide containing a boron element, an antimony element, an aluminum element, or a phosphorus element by a sputtering method using a silicon target. In this embodiment, as the protective insulating layer 403, a silicon oxide film with a thickness of 100 nm is formed using a columnar-like polycrystalline silicon target containing a boron element (resistivity: 0.01 Ωcm) in an oxygen atmosphere.

Figure 18:
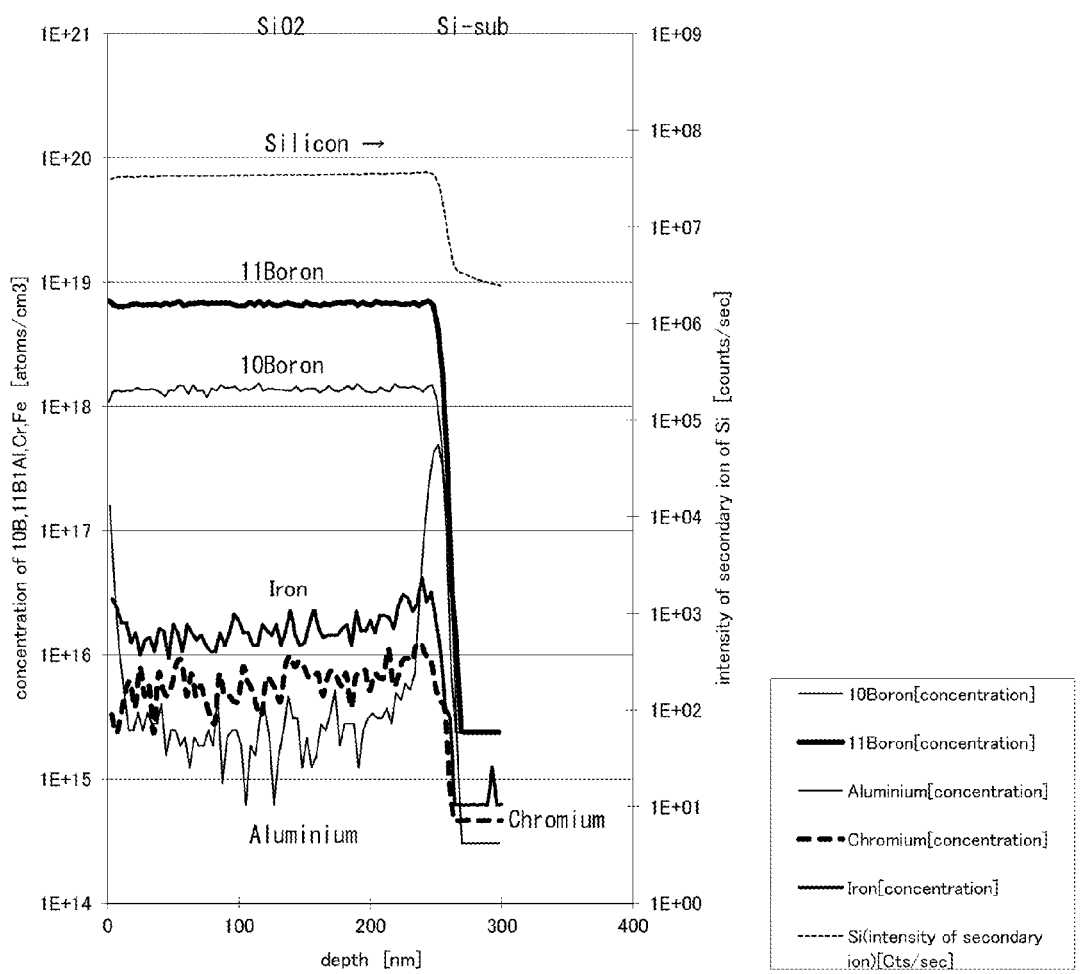
FIG. 18 is a graph showing the concentration of a boron element in a silicon oxide film.

Note that an insulating film formed of silicon oxide containing a boron element was formed with a thickness of 300 nm over a silicon wafer and the concentration of a boron element was measured by secondary ion mass spectrometry (SIMS). The insulating film was formed by a pulsed DC sputtering method in which a bias is applied in a pulsed manner using a columnar-like polycrystalline silicon target containing a boron element (resistivity: 0.01 Ωcm) in an oxygen atmosphere (the flow rate of oxygen was 100%) under the following conditions: the pressure was 0.4 Pa, the DC power source was 6 kW, the distance between the substrate and the target was 89 mm, and the substrate temperature was 100° C. FIG. 18 shows the measurement results. As shown in FIG. 18, the average value or the peak value of the concentration of a boron element in the silicon oxide film was $1\times10^{18}$ cm$^{-3}$ to $1\times10^{19}$ cm$^{-3}$ inclusive. The measurement results in FIG. 18 include results of analyzing not only a boron element but also an iron element, a chromium element, and an aluminum element.

With the structure of the thin film transistor 410 illustrated in FIG. 1D, entry of moisture from the outside can be prevented in a manufacturing process after the formation of the protective insulating layer 403 containing a boron element. Further, also after a device is completed as a semiconductor device including the thin film transistor using the protective insulating layer 403 containing a boron element such as a liquid crystal display device, entry of moisture from the outside can be prevented in the long term; therefore, the long-term reliability of the device can be improved. Furthermore, a silicon nitride film may be formed so as to cover the protective insulating layer 403 containing a boron element so that entry of moisture from the outside can further be prevented.

In addition, this embodiment describes a structure in which the oxide semiconductor layer of one thin film transistor is sandwiched between the silicon oxide films each containing a boron element (the first gate insulating layer 402a and the protective insulating layer 403) but is not limited thereto; a structure in which oxide semiconductor layers of a plurality of thin film transistors are sandwiched between silicon oxide films each containing a boron element may be employed.

Further, this embodiment is not limited to the structure in which the oxide semiconductor layer of the thin film transistor is sandwiched between the silicon oxide films each containing a boron element; a structure in which a silicon oxide film containing a boron element is at least provided over the oxide semiconductor layer may be employed. For example, when the substrate 400 is a glass substrate containing a boron element, since the main component of the glass substrate is silicon oxide, the oxide semiconductor layer of the thin film transistor is sandwiched by silicon oxide containing a boron element by providing the silicon oxide film containing a boron element over the oxide semiconductor layer of the thin film transistor.

(Embodiment 2)

In this embodiment, an example of a thin film transistor having a structure which is different from that of Embodiment 1 will be described below. FIG. 2D illustrates an example of a cross-sectional structure of the thin film transistor.

A thin film transistor 460 illustrated in FIG. 2D is an inverted coplanar thin film transistor (also referred to as a bottom contact thin film transistor) and includes, over a substrate 450 having an insulating surface, a gate electrode layer 451, a first gate insulating layer 452a, a second gate insulating layer 452b, an oxide semiconductor layer which includes at least a channel formation region 454, a source electrode layer 455a, and a drain electrode layer 455b. Moreover, an oxide insulating layer 456 which covers the thin film transistor 460 and is in contact with the channel formation region 454 is provided. Further, in the thin film transistor 460 illustrated in FIG. 2D, a protective insulating layer 457 is provided over the oxide insulating layer 456.

The protective insulating layer 457 is formed using an insulating layer that is formed of silicon oxide containing a boron element, an antimony element, an aluminum element, or a phosphorus element by a sputtering method. In this embodiment, a silicon oxide film containing a boron element is used for the oxide insulating layer 456 and the protective insulating layer 457.

Hereinafter, manufacturing steps of the thin film transistor 460 over the substrate will be described with reference to FIGS. 2A to 2D.

As in Embodiment 1, the gate electrode layer 451 is provided over the substrate 450 having an insulating surface. In addition, an insulating film serving as a base film may be provided between the substrate 450 and the gate electrode layer 451.

Then, as in Embodiment 1, the first gate insulating layer 452a and the second gate insulating layer 452b are formed over the gate electrode layer 451. As the first gate insulating layer 452a, a silicon oxide film with a thickness of 50 nm is formed by a sputtering method using a columnar-like polycrystalline silicon target containing a boron element (resistivity: 1 Ωcm to 10 Ωcm) in an oxygen atmosphere. The silicon oxide film used as the first gate insulating layer 452a contains a boron element. As the second gate insulating layer 452b, a 100-nm-thick silicon oxynitride film is formed by a PCVD method.

Next, a metal conductive film is formed over the second gate insulating layer 452b. After that, a resist mask is formed through a second photolithography step, and the metal conductive film is selectively etched to form the source electrode layer 455a and the drain electrode layer 455b. Examples of the material for the metal conductive film include an element selected from Al, Cr, Cu, Ta, Ti, Mo, and W; an alloy containing any of these elements as a component; and an alloy containing any of these elements in combination.

Then, the resist mask is removed, and an oxide semiconductor film 459 is formed over the second gate insulating layer 452b, the source electrode layer 455a, and the drain electrode layer 455b.

In this embodiment, the oxide semiconductor film 459 is formed by a sputtering method using an In—Ga—Zn—O based oxide semiconductor deposition target. The cross-sectional view of this stage corresponds to FIG. 2A. In addition, the oxide semiconductor film 459 can be formed by a sputtering method in a rare gas (typically, argon) atmosphere, an oxygen atmosphere, or an atmosphere containing a rare gas (typically, argon) and oxygen. In addition, in the case where a sputtering method is used, it is preferable that deposition be performed using a target containing $SiO_2$ at 2 wt % to 10 wt % inclusive, and $SiO_x$ (x>0), which inhibits crystallization, be contained in the oxide semiconductor film 459 so that crystallization can be suppressed when the heat treatment for dehydration or dehydrogenation is performed in a later step.

Note that before the oxide semiconductor film 459 is formed by a sputtering method, dust attached to a surface of the second gate insulating layer 452b is preferably removed by reverse sputtering in which plasma is generated by introduction of an argon gas. The reverse sputtering refers to a method in which without application of a voltage to the target side, an RF power source is used for application of a voltage to the substrate side in an argon atmosphere to generate plasma in the vicinity of the substrate so that the surface is modified. Note that instead of an argon atmosphere, nitrogen, helium, oxygen, or the like may be used.

Next, the oxide semiconductor film 459 is processed into an island-like oxide semiconductor layer 453 through a third photolithography step. A resist mask for forming the island-like oxide semiconductor layer may be formed by an ink jet method. A photomask is not used when the resist mask is formed by an ink-jet method, which results in reducing manufacturing costs.

Then, the oxide semiconductor layer is subjected to dehydration or dehydrogenation. The temperature of first heat treatment for dehydration or dehydrogenation is greater than or equal to 400° C. and less than or equal to 750° C., preferably greater than or equal to 400° C. and less than the strain point of the substrate. Here, after the substrate is put in an electric furnace which is a kind of heat treatment apparatus and heat treatment is performed on the oxide semiconductor layer at 450° C. for one hour in a nitrogen atmosphere, water or hydrogen is prevented from entering the oxide semiconductor layer without exposure to the air; thus, the oxide semiconductor layer 453 is obtained (see FIG. 2B).

For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment for a short time.

In accordance with conditions of the first heat treatment or a material of the oxide semiconductor layer, the oxide semiconductor layer is crystallized and changed to a microcrystalline film or a polycrystalline film in some cases.

The first heat treatment of the oxide semiconductor layer may be performed on the oxide semiconductor film 459 before being processed into the island-like oxide semiconductor layer. In that case, after the first heat treatment, the substrate is taken out of the heat treatment apparatus and a photolithography step is performed.

Then, plasma treatment using a gas such as $N_2O$, $N_2$, or Ar is performed. This plasma treatment removes water or the like adsorbed on a surface of the oxide semiconductor layer which is exposed. In addition, plasma treatment may be performed using a mixed gas of oxygen and argon.

Figure 2A:
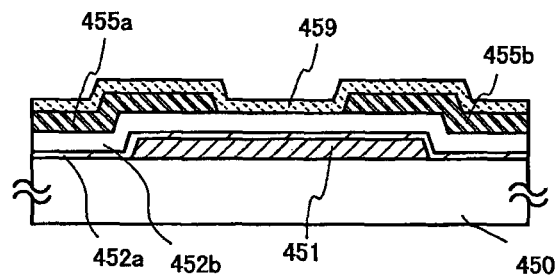
FIGS. 2A to 2D are cross-sectional views illustrating an embodiment of the present invention.
Figure 2B:
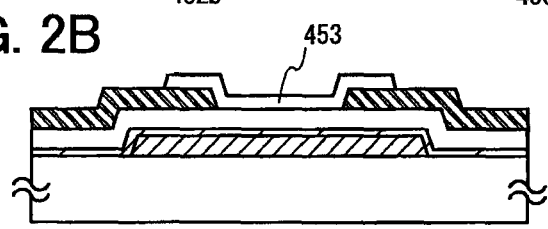
Figure 2C:
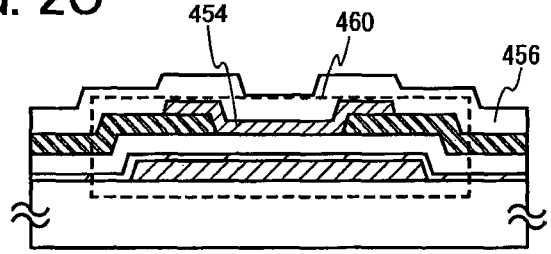
Figure 2D:
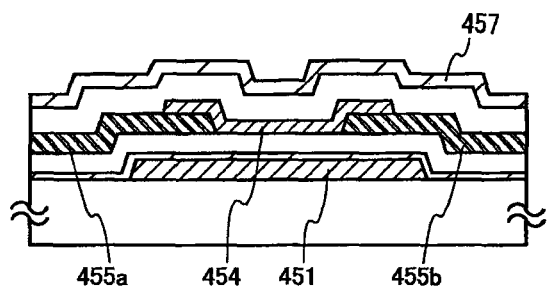

After the plasma treatment, the oxide insulating layer 456 which serves as a protective insulating film and is in contact with the oxide semiconductor layer is formed without exposure to the air (see FIG. 2C). The oxide insulating layer 456 can be formed to a thickness at least 1 nm by a sputtering method or the like as appropriate, which is a method with which an impurity such as water or hydrogen does not enter the oxide insulating layer 456.

Examples of a sputtering method include an RF sputtering method in which a high-frequency power source is used for a sputtering power source, a DC sputtering method using a DC power source, and a pulsed DC sputtering method in which a bias is applied in a pulsed manner.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a deposition method using a sputtering method, there are also a reactive sputtering method in which a target substance and a sputtering gas component are chemically reacted with each other during deposition to form a thin compound film thereof, and a bias sputtering method in which a voltage is also applied to a substrate during deposition.

Then, the protective insulating layer 457 is formed over the oxide insulating layer 456 (see FIG. 2D). The protective insulating layer 457 is formed using an insulating layer that is formed of silicon oxide containing a boron element, an antimony element, an aluminum element, or a phosphorus element by a sputtering method using a silicon target.

In this embodiment, the oxide insulating layer 456 and the protective insulating layer 457 are stacked as follows. Two targets, a first silicon target containing a boron element and a second silicon target containing a larger amount of a boron element than the first silicon target, are put in the same chamber, and the oxide insulating layer 456 and the protective insulating layer 457 are successively formed in the same chamber by switching the targets used with a shutter in an oxygen atmosphere.

In this embodiment, a 200-nm-thick silicon oxide film containing a boron element and a 100-nm-thick silicon oxide film containing a boron element are formed as the oxide insulating layer 456 and the protective insulating layer 457, respectively. Note that the concentration of a boron element contained in the protective insulating layer 457 is higher than that in the oxide insulating layer 456. The substrate temperature in deposition of these insulating layers may be in the range of room temperature to 300° C. inclusive, and is 100° C. in this embodiment. The silicon oxide film can be formed by a sputtering method in a rare gas (typically argon) atmosphere, an oxygen atmosphere, or an atmosphere containing a rare gas (typically argon) and oxygen. Further, a silicon oxide target or a silicon target can be used as a target.

In addition, the targets used may be switched plural times with the use of a shutter in an oxygen atmosphere, and the protective insulating layer 457 may have a layered structure including four or more layers, including insulating layers with a high concentration of a boron element and insulating layers with a low concentration of a boron element.

Furthermore, so-called co-sputtering is used to form the protective insulating layer 457 in which the concentration of a boron element has a gradient. In the co-sputtering, two targets, a silicon target which does not contain a boron element and a silicon target which contains a boron element, are placed in the same chamber, and sputtering using these targets is performed at the same time.

Next, second heat treatment (preferably at 200° C. to 400° C. inclusive, for example, 250° C. to 350° C. inclusive) is performed in an inert gas atmosphere or an oxygen gas atmosphere. For example, the second heat treatment is performed at 250° C. for one hour in a nitrogen atmosphere. With the second heat treatment, heat is applied while the oxide semiconductor layer is in contact with the oxide insulating layer 456.

Through the above steps, the thin film transistor 460 is formed.

With the structure of the thin film transistor 460 illustrated in FIG. 2C, entry of moisture from the outside can be prevented in a manufacturing process after formation of the protective insulating layer 457 containing a boron element. In addition, it is possible to prevent entry of moisture from the outside in the long term even after a device is completed as a semiconductor device including the thin film transistor using the protective insulating layer 457 containing a boron element, for example, as a liquid crystal display device; thus, the long-term reliability of the device can be improved.

In addition, this embodiment describes a structure in which the oxide semiconductor layer of one thin film transistor is sandwiched between the silicon oxide films each containing a boron element (the first gate insulating layer 452a and the protective insulating layer 457) but is not limited thereto; a structure in which oxide semiconductor layers of a plurality of thin film transistors are sandwiched between silicon oxide films each containing a boron element may be employed.

This embodiment can be freely combined with Embodiment 1.

(Embodiment 3)

In this embodiment, an example of a thin film transistor having a structure which is different from that of Embodiment 1 will be described below. FIG. 3D illustrates an example of a cross-sectional structure of the thin film transistor.

A thin film transistor 310 illustrated in FIG. 3D is a channel stop thin film transistor and includes, over a substrate 300 having an insulating surface, a gate electrode layer 311, a first gate insulating layer 302a, a second gate insulating layer 302b, an oxide semiconductor layer which includes at least a channel formation region 313c, a source electrode layer 315a, and a drain electrode layer 315b. Moreover, an oxide insulating layer 316 which is on and in contact with the channel formation region 313c is provided, and a protective insulating layer 307 is provided over the oxide insulating layer 316.

The protective insulating layer 307 is formed using an insulating layer formed of silicon oxide containing a boron element, an antimony element, an aluminum element, or a phosphorus element by a sputtering method. In this embodiment, an insulating layer formed of silicon oxide containing a phosphorus element is used.

A process for forming the thin film transistor 310 over the substrate is described below with reference to FIGS. 3A to 3D.

As in Embodiment 1, the gate electrode layer 311 is provided over the substrate 300 having an insulating surface. Further, an insulating film serving as a base film may be provided between the substrate 300 and the gate electrode layer 311.

Then, as in Embodiment 1, the first gate insulating layer 302a and the second gate insulating layer 302b are formed over the gate electrode layer 311. As the first gate insulating layer 302a, a silicon oxide film with a thickness of 50 nm is formed by a sputtering method using a columnar-like polycrystalline silicon target containing a boron element (resistivity: 1 Ωcm to 10 Ωcm) in an oxygen atmosphere. The silicon oxide film used as the first gate insulating layer 302a contains a boron element. As the second gate insulating layer 302b, a 100-nm-thick silicon oxynitride film is formed by a PCVD method Next, an oxide semiconductor film 330 is formed over the second gate insulating layer 302b.

In this embodiment, the oxide semiconductor film 330 is formed by a sputtering method with the use of an In—Ga—Zn—O-based oxide semiconductor deposition target. A cross-sectional view of this stage corresponds to FIG. 3A. In addition, the oxide semiconductor film 330 can be formed by a sputtering method in a rare gas (typically, argon) atmosphere, an oxygen atmosphere, or an atmosphere containing a rare gas (typically, argon) and oxygen.

Then, plasma treatment using a gas such as $N_2O$, $N_2$, or Ar is performed. This plasma treatment removes water or the like adsorbed on a surface of the oxide semiconductor film 330 which is exposed. In addition, plasma treatment may be performed using a mixed gas of oxygen and argon.

After the plasma treatment, the oxide insulating layer 316 which serves as a channel protective insulating film and is in contact with the oxide semiconductor film 330 is formed without exposure to the air. The oxide insulating layer 316 can be formed to a thickness at least 1 nm by a sputtering method or the like as appropriate, which is a method with which an impurity such as water or hydrogen does not enter the oxide insulating layer 316. In this embodiment, a silicon oxide film is formed by a sputtering method using a silicon target and then selectively etched through a photolithography step to form the oxide insulating layer 316.

Figure 3A:
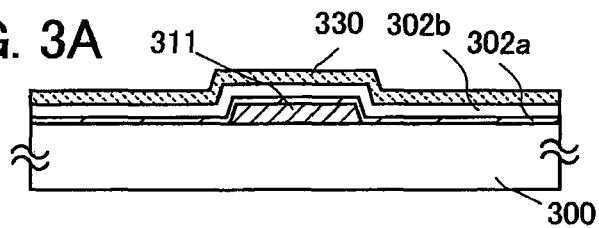
FIGS. 3A to 3D are cross-sectional views illustrating an embodiment of the present invention.
Figure 3B:
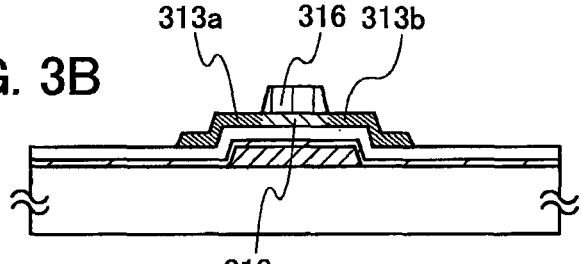
Figure 3C:
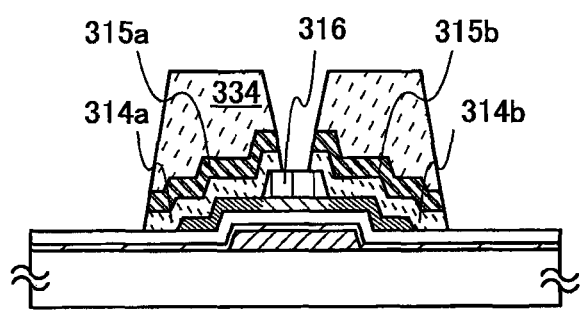
Figure 3D:
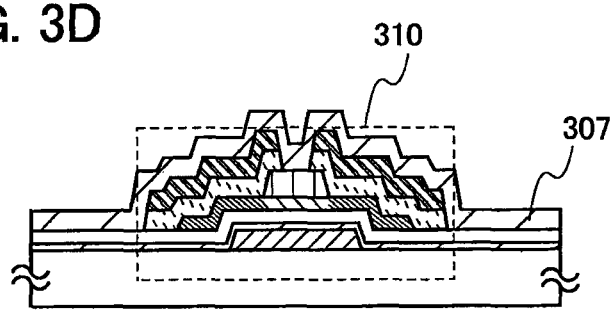

Next, the oxide semiconductor film 330 is processed into an island-like oxide semiconductor layer through a photolithography step (see FIG. 3B).

Next, an oxide conductive film and a metal conductive film are stacked over the island-like oxide semiconductor layer and the oxide insulating layer 316, and a resist mask 334 is formed through a photolithography step. Then, etching is performed selectivity to form oxide conductive layers 314*a* and 314*b*, the source electrode layer 315*a*, and the drain electrode layer 315*b* (see FIG. 3C). Examples of the material of the oxide conductive film include zinc oxide, zinc aluminum oxide, zinc aluminum oxynitride, and zinc gallium oxide. Examples of the material for the metal conductive film include an element selected from Al, Cr, Cu, Ta, Ti, Mo, and W; an alloy containing any of these elements as a component; and an alloy containing any of these elements in combination.

The oxide conductive layer 314*a* is formed below and in contact with the source electrode layer 315*a*, and the oxide conductive layer 314*b* is formed below and in contact with the drain electrode layer 315*b*. By providing the oxide conductive layer 314*a* between the source electrode layer 315*a* and the oxide semiconductor layer, contact resistance can be decreased, which leads to a resistance reduction, so that a thin film transistor which can operate at high speed can be formed.

Next, the resist mask 334 is removed, and second heat treatment (preferably at 200° C. to 400° C. inclusive, for example, 250° C. to 350° C. inclusive) is performed in an inert gas atmosphere or an oxygen gas atmosphere. For example, the second heat treatment is performed at 250° C. for one hour in a nitrogen atmosphere. With the second heat treatment, heat is applied while part of the oxide semiconductor layer (the channel formation region) is in contact with the oxide insulating layer 316.

Next, the protective insulating layer 307 is formed over the source electrode layer 315*a* and the drain electrode layer 315*b*. In addition, the protective insulating layer 307 is provided to be in contact with a region of the second gate insulating layer 302*b* which is exposed. The protective insulating layer 307 is formed using an insulating layer formed of silicon oxide containing a boron element, an antimony element, an aluminum element, or a phosphorus element by a sputtering method using a silicon target. In this embodiment, as the protective insulating layer 307, a silicon oxide film with a thickness of 100 nm is formed using a columnar-like polycrystalline silicon target containing a phosphorus element (resistivity: less than or equal to 5 Ωcm) in an oxygen atmosphere.

Through the above steps, the thin film transistor 310 is formed.

With the structure of the thin film transistor 310 illustrated in FIG. 3D, entry of moisture from the outside can be prevented in a manufacturing process after formation of the protective insulating layer 307 containing a phosphorus element. In addition, it is possible to prevent entry of moisture from the outside in the long term even after a device is completed as a semiconductor device including the thin film transistor using the protective insulating layer 307 containing a phosphorus element, for example, as a liquid crystal display device; thus, the long-term reliability of the device can be achieved.

This embodiment can be freely combined with any of other embodiments.

For example, an oxide conductive layer may be provided between the oxide semiconductor layer and the source electrode layer (or the drain electrode layer) in the structure of Embodiment 1. By providing the oxide conductive layer, contact resistance can be decreased, which leads to a resistance reduction, so that a thin film transistor which can operate at high speed can be formed.

(Embodiment 4)

In this embodiment, an example of manufacturing an active matrix light-emitting display device using a plurality of the thin film transistors described in Embodiment 2 and a light-emitting element using electroluminescence will be described.

Light-emitting elements utilizing electroluminescence are classified according to whether a light-emitting material is an organic compound or an inorganic compound. In general, the former is referred to as an organic EL element, and the latter is referred to as an inorganic EL element.

In the organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, such a light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer in which particles of a light-emitting material are dispersed in a binder, and its light emission mechanism is donor-acceptor recombination type light emission that utilizes a donor level and an acceptor level. A thin-film inorganic EL element has a structure in which a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 4:
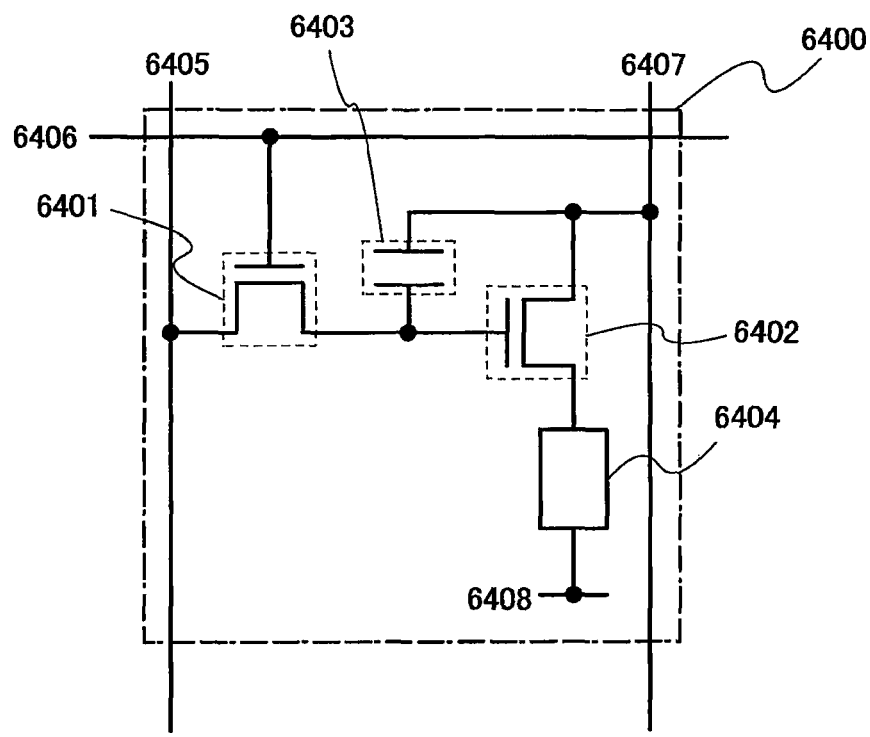
FIG. 4 is an equivalent circuit diagram of a pixel according to an embodiment of the present invention.

FIG. 4 illustrates an example of a pixel structure to which digital time grayscale driving can be applied, as an example of a semiconductor device.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 via the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

The second electrode (the common electrode 6408) of the light-emitting element 6404 is set to a low power supply potential. Note that the low power supply potential is a potential satisfying the low power supply potential<a high power supply potential with reference to the high power supply potential that is set for the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is greater than or equal to a forward threshold voltage of the light-emitting element 6404.

Note that gate capacitance of the driving transistor 6402 may be used as a substitute for the capacitor 6403 so that the capacitor 6403 can be omitted. The gate capacitance of the driving transistor 6402 may be formed between the channel region and the gate electrode.

In the case of a voltage-input voltage driving method, a video signal is input to the gate of the driving transistor 6402 so that the driving transistor 6402 is in either of two states of being sufficiently turned on and turned off. That is, the driving transistor 6402 operates in a linear region. Since the driving transistor 6402 operates in a linear region, a voltage higher than the voltage of the power supply line 6407 is applied to the gate of the driving transistor 6402. Note that a voltage greater than or equal to (voltage of the power supply line+Vth of the driving transistor 6402) is applied to the signal line 6405.

In the case of performing analog grayscale driving instead of digital time grayscale driving, the same pixel structure as that in FIG. 4 can be used by changing signal input.

In the case of performing analog grayscale driving, a voltage greater than or equal to (forward voltage of the light-emitting element 6404+Vth of the driving transistor 6402) is applied to the gate of the driving transistor 6402. The forward voltage of the light-emitting element 6404 indicates a voltage at which a desired luminance is obtained, and includes at least forward threshold voltage. A video signal by which the driving transistor 6402 operates in a saturation region is input, so that current can be supplied to the light-emitting element 6404. In order to operate the driving transistor 6402 in a saturation region, the potential of the power supply line 6407 is set higher than the gate potential of the driving transistor 6402. When an analog video signal is used, it is possible to feed current to the light-emitting element 6404 in accordance with the video signal and perform analog grayscale driving.

Note that a pixel structure of the present invention is not limited to that illustrated in FIG. 4. For example, a switch, a resistor, a capacitor, a transistor, a logic circuit, or the like may be added to the pixel illustrated in FIG. 4.

Next, structures of a light-emitting element are described with reference to FIGS. 5A to 5C. Here, a cross-sectional structure of a pixel is described by taking an n-channel driving TFT as an example. Driving TFTs 7011, 7021, and 7001 used in semiconductor devices illustrated in FIGS. 5A, 5B, and 5C, respectively can be formed in a manner similar to that of the thin film transistor described in Embodiment 2 and are highly reliable thin film transistors each including an oxide semiconductor layer.

In order to extract light emitted from a light-emitting element, at least one of an anode and a cathode may be transparent. A thin film transistor and a light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side. The pixel structure can be applied to a light-emitting element having any of these emission structures.

A light-emitting element having the bottom-emission structure is described with reference to FIG. 5A.

FIG. 5A illustrates a cross-sectional view of a pixel in the case where the driving TFT 7011 is an n-channel transistor and light is emitted from a light-emitting element 7012 to a first electrode 7013 side. In FIG. 5A, the first electrode 7013 of the light-emitting element 7012 is formed over a light-transmitting conductive film 7017 which is electrically connected to a drain electrode layer of the driving TFT 7011, and an EL layer 7014 and a second electrode 7015 are stacked in this order over the first electrode 7013.

As the light-transmitting conductive film 7017, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

The first electrode 7013 of the light-emitting element can be formed using a variety of materials; it is preferable to use a material having a low work function, specifically, an alkali metal such as Li or Cs, an alkaline-earth metal such as Mg, Ca, or Sr, an alloy containing any of these (Mg:Ag, Al:Li, or the like), or a rare-earth metal such as Yb or Er when the first electrode 7013 is used as a cathode. In FIG. 5A, the thickness of the first electrode 7013 is a thickness with which light can be transmitted (preferably, about 5 nm to 30 nm). For example, an aluminum film with a thickness of 20 nm can be used as the first electrode 7013.

Note that the light-transmitting conductive film and the aluminum film may be stacked and then selectively etched, so that the light-transmitting conductive film 7017 and the first electrode 7013 may be formed. In this case, the etching can be performed using the same mask, which is preferable.

Further, the periphery of the first electrode 7013 is covered with a partition 7019. The partition 7019 is formed using a film of an organic resin such as polyimide, acrylic, polyamide, or epoxy, an inorganic insulating film, or organic polysiloxane. It is particularly preferable that the partition 7019 be formed using a photosensitive resin material to have an opening portion over the first electrode 7013 so that a sidewall of the opening portion is formed as a tilted surface with continuous curvature. When a photosensitive resin material is used for the partition 7019, a step of forming a resist mask can be omitted.

In addition, the EL layer 7014 formed over the first electrode 7013 and the partition 7019 needs to include at least a light-emitting layer, and the EL layer 7014 may be formed of a single layer or a plurality of layers stacked. When the EL layer 7014 is formed using a plurality of layers, an electron-injection layer, an electron-transport layer, a light-emitting layer, a hole-transport layer, and a hole-injection layer are stacked in this order over the first electrode 7013 functioning as a cathode. However, it is not necessary to form all of these layers.

In addition, the EL layer 7014 is not limited to have the above layered structure; the first electrode 7013 may be made to function as an anode, and a hole-injection layer, a hole-transport layer, a light-emitting layer, an electron-transport layer, and an electron-injection layer may be stacked in this order over the first electrode 7013. However; considering power consumption, it is preferable that the first electrode 7013 be made to function as a cathode and an electron-injection layer, an electron-transport layer, a light-emitting layer; a hole-transport layer; and a hole-injection layer be stacked in this order over the first electrode 7013 so that the voltage of a driver circuit portion can be prevented from increasing and the power consumption can be reduced.

In addition, the second electrode 7015 formed over the EL layer 7014 can be formed using a variety of materials. For example, when the second electrode 7015 is used as an anode, a material with a high work function such as ZrN, Ti, W, Ni, Pt, or Cr, or a transparent conductive material such as ITO, IZO, or ZnO is preferable. Further, a light-blocking film 7016, e.g., a metal which blocks light, a metal which reflects light, or the like is formed over the second electrode 7015. In this embodiment, the second electrode 7015 is formed using an ITO film, and the light-blocking film 7016 is formed using a Ti film.

The light-emitting element 7012 corresponds to a region where the first electrode 7013 and the second electrode 7015 sandwich the EL layer 7014 including a light-emitting layer. In the case of the element structure illustrated in FIG. 5A, light is emitted from the light-emitting element 7012 to the first electrode 7013 side as indicated by an arrow.

Note that FIG. 5A illustrates an example in which a light-transmitting conductive film is used as the gate electrode layer, and light is emitted from the light-emitting element 7012 through a color filter layer 7033 and a substrate.

The color filter layer 7033 is formed by a droplet discharge method such as an ink-jet method, a printing method, an etching method with the use of a photolithography technique, or the like.

The color filter layer 7033 is covered with an overcoat layer 7034, and also covered with a protective insulating layer 7035. Note that the overcoat layer 7034 with a small thickness is illustrated in FIG. 5A; however, the overcoat layer 7034 has a function to planarize a surface with unevenness due to the color filter layer 7033.

A contact hole which is formed in the protective insulating layer 7035, an insulating layer 7032, and an insulating layer 7031 and reaches the drain electrode layer is provided in a portion which overlaps with the partition 7019.

Next, a light-emitting element with a dual-emission structure is described with reference to FIG. 5B.

In FIG. 5B, a first electrode 7023 of a light-emitting element 7022 is formed over a light-transmitting conductive film 7027 which is electrically connected to a drain electrode layer of the driving TFT 7021, and an EL layer 7024 and a second electrode 7025 are stacked in this order over the first electrode 7023.

As the light-transmitting conductive film 7027, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

In addition, the first electrode 7023 can be formed using a variety of materials.

When the first electrode 7023 is used as a cathode, for example, it is preferable to use a material having a low work function, specifically, an alkali metal such as Li or Cs, an alkaline-earth metal such as Mg, Ca, or Sr, an alloy containing any of these (Mg:Ag, Al:Li, or the like), a rare-earth metal such as Yb or Er, or the like. In this embodiment, the first electrode 7023 is used as a cathode and has a thickness with which light can be transmitted (preferably, approximately 5 nm to 30 nm). For example, an aluminum film with a thickness of 20 nm is used as the first electrode 7023.

Note that the light-transmitting conductive film and the aluminum film may be stacked and then selectively etched, so that the light-transmitting conductive film 7027 and the first electrode 7023 may be formed. In that case, etching can be performed with the use of the same mask, which is preferable.

The periphery of the first electrode 7023 is covered with a partition 7029. The partition 7029 is formed using a film of an organic resin such as polyimide, acrylic, polyamide, or epoxy, an inorganic insulating film, or organic polysiloxane. It is particularly preferable that the partition 7029 be formed using a photosensitive resin material to have an opening portion over the first electrode 7023 so that a sidewall of the opening portion is formed as a tilted surface with continuous curvature. When a photosensitive resin material is used for the partition 7029, a step of forming a resist mask can be omitted.

In addition, the EL layer 7024 formed over the first electrode 7023 and the partition 7029 needs to include at least a light-emitting layer, and the EL layer 7024 may be formed of a single layer or a plurality of layers stacked. When the EL layer 7024 is formed using a plurality of layers, an electron-injection layer, an electron-transport layer, a light-emitting layer; a hole-transport layer; and a hole-injection layer are stacked in this order over the first electrode 7023 functioning as a cathode. However, it is not necessary to form all of these layers.

In addition, the EL layer 7024 is not limited to have the above layered structure; the first electrode 7023 may be used as an anode, and a hole-injection layer, a hole-transport layer, a light-emitting layer, an electron-transport layer, and an electron-injection layer may be stacked in this order over the anode. However, considering power consumption, it is preferable that the first electrode 7023 be used as a cathode and an electron-injection layer, an electron-transport layer, a light-emitting layer, a hole-transport layer, and a hole-injection layer be stacked in this order over the cathode so that the power consumption can be reduced.

In addition, the second electrode 7025 formed over the EL layer 7024 can be formed using a variety of materials. For example, when the second electrode 7025 is used as an anode, a material with a high work function or a transparent conductive material such as ITO, IZO, or ZnO is preferable. In this embodiment, the second electrode 7025 is used as an anode and formed using an ITO film containing silicon oxide.

The light-emitting element 7022 corresponds to a region where the first electrode 7023 and the second electrode 7025 sandwich the EL layer 7024 including a light-emitting layer. In the case of the element structure illustrated in FIG. 5B, light is emitted from the light-emitting element 7022 to both the second electrode 7025 side and the first electrode 7023 side as indicated by arrows.

Note that FIG. 5B illustrates an example in which a light-transmitting conductive film is used as a gate electrode layer, and light emitted from the light-emitting element 7022 to the first electrode 7023 side passes through a color filter layer 7043 and a substrate.

The color filter layer 7043 is formed by a droplet discharge method such as an ink-jet method, a printing method, an etching method with the use of a photolithography technique, or the like.

The color filter layer 7043 is covered with an overcoat layer 7044, and also covered with a protective insulating layer 7045.

A contact hole which is formed in the protective insulating layer 7045, an insulating layer 7042, and an insulating layer 7041 and reaches the drain electrode layer is provided in a portion which overlaps with the partition 7029.

Note that when a light-emitting element having a dual emission structure is used and full color display is performed on both display surfaces, light from the second electrode 7025 side does not pass through the color filter layer 7043; therefore, a sealing substrate provided with another color filter layer is preferably provided over the second electrode 7025.

Next, a light-emitting element having a top emission structure is described with reference to FIG. 5C.

FIG. 5C is a cross-sectional view of a pixel in the case where the driving TFT 7001 is an n-channel transistor and light is emitted from a light-emitting element 7002 to the second electrode 7005 side. In FIG. 5C, a first electrode 7003 of the light-emitting element 7002 which is electrically connected to a drain electrode layer of the driving TFT 7001 is formed, and an EL layer 7004 and the second electrode 7005 are stacked in this order over the first electrode 7003.

The first electrode 7003 can be formed using a variety of materials. For example, when the first electrode 7003 is used as a cathode, a material with a low work function, specifically, an alkali metal such as Li or Cs; an alkaline-earth metal such as Mg, Ca, or Sr; an alloy containing any of these (Mg:Ag, Al: Li, or the like); a rare-earth metal such as Yb or Er; or the like is preferable.

The periphery of the first electrode 7003 is covered with a partition 7009. The partition 7009 is formed using a film of an organic resin such as polyimide, acrylic, polyamide, or epoxy, an inorganic insulating film, or organic polysiloxane. It is particularly preferable that the partition 7009 be formed using a photosensitive resin material to have an opening portion over the first electrode 7003 so that a sidewall of the opening portion is formed as a tilted surface with continuous curvature. When a photosensitive resin material is used for the partition 7009, a step of forming a resist mask can be omitted.

The EL layer 7004 formed over the first electrode 7003 and the partition 7009 needs to include at least a light-emitting layer, and the EL layer 7004 may be formed of a single layer or a plurality of layers stacked. When the EL layer 7004 is formed using a plurality of layers, an electron-injection layer, an electron-transport layer; a light-emitting layer, a hole-transport layer, and a hole-injection layer are stacked in this order over the first electrode 7003 functioning as a cathode. However, it is not necessary to form all of these layers.

In addition, the EL layer 7004 is not limited to have the above layered structure; a hole-injection layer, a hole-transport layer, a light-emitting layer, an electron-transport layer, and an electron-injection layer may be stacked in this order over the first electrode 7003 used as an anode.

In FIG. 5C, a hole-injection layer, a hole-transport layer, a light-emitting layer, an electron-transport layer, and an electron-injection layer are stacked in this order over a stacked film in which a Ti film, an aluminum film, and a Ti film are stacked in this order, and thereover, a stacked layer of a Mg:Ag alloy thin film and ITO is formed.

Note that, when the TFT 7001 is an n-channel transistor, it is preferable that an electron-injection layer, an electron-transport layer, a light-emitting layer, a hole-transport layer, and a hole-injection layer be stacked in this order over the first electrode 7003 so that the voltage of a driver circuit can be prevented from increasing and the power consumption can be reduced.

The second electrode 7005 is formed using a light-transmitting conductive film such as a film of indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

A region where the EL layer 7004 including a light-emitting layer is sandwiched between the first electrode 7003 and the second electrode 7005 corresponds to the light-emitting element 7002. In the case of the pixel illustrated in FIG. 5C, light is emitted from the light-emitting element 7002 to the second electrode 7005 side as indicated by an arrow.

In FIG. 5C, an example in which the thin film transistor 460 is used as the TFT 7001 is illustrated; however, there is no particular limitation, and the thin film transistor 410 can be used. When the thin film transistor 410 is used as the TFT 7001, the first electrode 7003 and the drain electrode layer are electrically connected so as to be in contact with each other.

In FIG. 5C, the drain electrode layer of the TFT 7001 is electrically connected to the first electrode 7003 through a contact hole provided in an oxide insulating layer 7051, a protective insulating layer 7052, and an insulating layer 7055. A planarization insulating layer 7053 is formed using a resin material such as polyimide, acrylic, benzocyclobutene, polyamide, or epoxy. In addition to such a resin material, it is possible to use a low-dielectric constant material (a low-k material), a siloxane-based resin, PSG (phosphosilicate glass), BPSG (borophosphosilicate glass), or the like.

Note that the planarization insulating layer 7053 may be formed by stacking a plurality of insulating films formed using these materials. There is no particular limitation on the method for forming the planarization insulating layer 7053. The planarization insulating layer 7053 can be formed, depending on the material, by a method such as a sputtering method, an SOG method, a spin coating method, a dipping method, a spray coating method, or a droplet discharge method (e.g., an ink-jet method, screen printing, or offset printing), or a tool (equipment) such as a doctor knife, a roll coater, a curtain coater, or a knife coater.

The partition 7009 is provided so as to insulate the first electrode 7003 and a first electrode of an adjacent pixel. The partition 7009 is formed using a film of an organic resin such as polyimide, acrylic, polyamide, or epoxy, an inorganic insulating film, or organic polysiloxane. It is particularly preferable that the partition 7009 be formed using a photosensitive resin material to have an opening portion over the first electrode 7003 so that a sidewall of the opening portion is formed as a tilted surface with continuous curvature. When a photosensitive resin material is used for the partition 7009, a step of forming a resist mask can be omitted.

In the structure of FIG. 5C, when full color display is performed, for example, the light-emitting element 7002 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements, which include a white light-emitting element as well as three kinds of light-emitting elements.

In the structure of FIG. 5C, a light-emitting display device capable of full color display may be manufactured in such a way that all of a plurality of light-emitting elements which are arranged are white light-emitting elements and a sealing substrate having a color filter or the like is arranged over the light-emitting element 7002. When a material which exhibits a single color such as white is formed and combined with a color filter or a color conversion layer, full color display can be performed.

Needless to say, display of monochromatic light emission can be performed. For example, a lighting system may be formed with the use of white light emission, or an area-color light-emitting device may be formed with the use of monochromatic light emission.

If necessary, an optical film such as a polarizing film including a circularly polarizing plate may be provided.

Note that, although the organic EL elements are described here as the light-emitting elements, an inorganic EL element can be provided as a light-emitting element.

Note that the example is described in which the thin film transistor (the driving TFT) which controls the driving of the light-emitting element is electrically connected to the light-emitting element; however, a structure may be employed in which a TFT for current control is connected between the driving TFT and the light-emitting element.

(Embodiment 5)

Figure 6A:
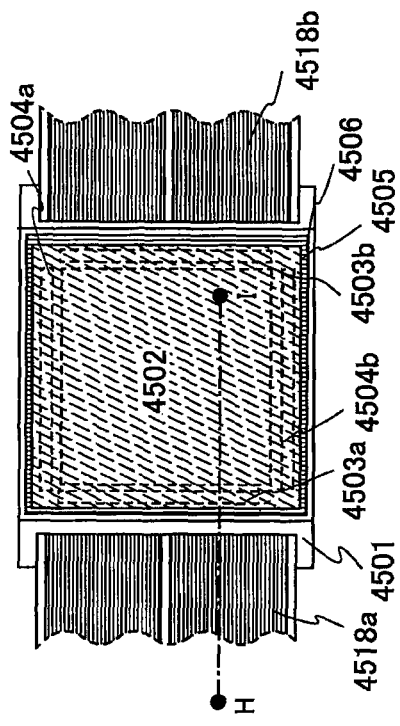
FIG. 6A is a top view and FIG. 6B is a cross-sectional view illustrating a display device according to an embodiment of the present invention.
Figure 6B:
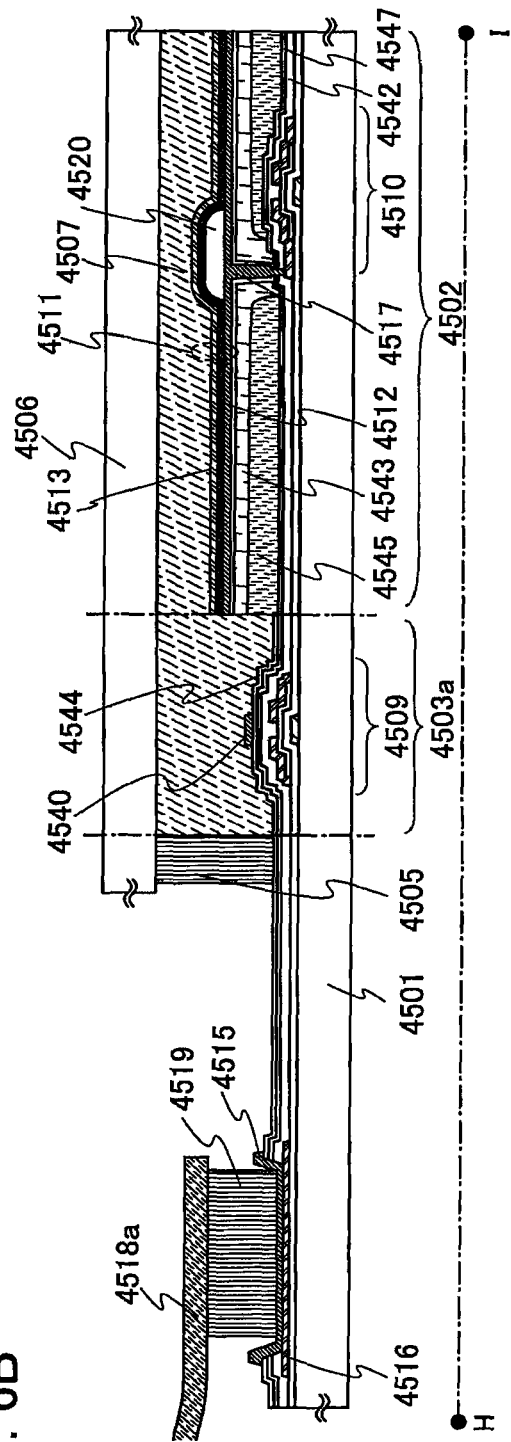

In this embodiment, the appearance and the cross section of a light-emitting display panel (also referred to as a light-emitting panel) will be described with reference to FIGS. 6A and 6B. FIG. 6A is a plan view of a panel in which a thin film transistor and a light-emitting element formed over a first substrate are sealed between the first substrate and a second substrate with a sealant. FIG. 6B is a cross-sectional view taken along line H-I of FIG. 6A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that the panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of thin film transistors. A thin film transistor 4510 included in the pixel portion 4502 and a thin film transistor 4509 included in the signal line driver circuit 4503a are illustrated as an example in FIG. 6B.

As for the thin film transistors 4509 and 4510, the highly reliable thin film transistor 410 including the oxide semiconductor layer described in Embodiment 1 can be employed for the thin film transistor 4510 for a pixel, and the thin film transistor 4509 for a driver circuit has a conductive layer in a position overlapping with the channel formation region of the oxide semiconductor layer in the thin film transistor described in Embodiment 1. In this embodiment, the thin film transistors 4509 and 4510 are n-channel thin film transistors.

A conductive layer 4540 is provided over part of an insulating layer 4544, which overlaps with the channel formation region of the oxide semiconductor layer, in the thin film transistor 4509 for the driver circuit. When the conductive layer 4540 is provided at the position overlapping with the channel formation region of the oxide semiconductor layer, the amount of change in threshold voltage of the thin film transistor 4509 before and after the BT test can be reduced. A potential of the conductive layer 4540 may be the same as or different from that of a gate electrode layer in the thin film transistor 4509. The conductive layer 4540 can also function as a second gate electrode layer. In addition, the potential of the conductive layer 4540 may be GND or 0 V, or the conductive layer 4540 may be placed in a floating state.

Further, the thin film transistor 4510 is electrically connected to a first electrode 4517. Further, an oxide insulating layer 4542 covering the oxide semiconductor layer of the thin film transistor 4510 is formed.

The oxide insulating layer 4542 can be formed using a material and a method which are similar to those of the oxide insulating layer 416 described in Embodiment 1. In addition, an insulating layer 4547 which covers the oxide insulating layer 4542 is formed. The insulating layer 4547 may be formed using a silicon oxide film containing a boron element by a sputtering method, in a manner similar to that of the protective insulating layer 403 described in Embodiment 1.

A color filter layer 4545 is formed over the thin film transistor 4510 so as to overlap with a light-emitting region of a light-emitting element 4511.

Further, in order to reduce the surface roughness of the color filter layer 4545, the color filter layer 4545 is covered with an overcoat layer 4543 functioning as a planarization insulating film.

Further, an insulating layer 4544 is formed over the overcoat layer 4543.

Moreover, reference numeral 4511 denotes a light-emitting element. The first electrode 4517 which is a pixel electrode included in the light-emitting element 4511 is electrically connected to a source or drain electrode layer of the thin film transistor 4510. Note that although the light-emitting element 4511 has a layered structure of the first electrode 4517, an electroluminescent layer 4512, and a second electrode 4513, the structure of the light-emitting element 4511 is not limited to the structure described in this embodiment. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material to have an opening portion over the first electrode 4517 so that a sidewall of the opening portion is formed as a tilted surface with continuous curvature.

The electroluminescent layer 4512 may be formed with a single layer or a plurality of layers stacked.

In order to prevent entry of oxygen, hydrogen, moisture, carbon dioxide, or the like into the light-emitting element 4511, a protective film may be formed over the second electrode 4513 and the partition 4520. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed using the same conductive film as the first electrode 4517 included in the light-emitting element 4511, and a terminal electrode 4516 is formed using the same conductive film as the source and drain electrode layers included in the thin film transistor 4509.

The connection terminal electrode 4515 is electrically connected to a terminal included in the FPC 4518a via an anisotropic conductive film 4519.

The second substrate 4506 located in the direction in which light is extracted from the light-emitting element 4511 should have a light-transmitting property. In that case, a light-transmitting material such as a glass plate, a plastic plate, a polyester film, or an acrylic film is used for the second substrate 4506.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503*a* and 4503*b* and the scan line driver circuits 4504*a* and 4504*b* may be mounted as driver circuits formed using a single crystal semiconductor film or a polycrystalline semiconductor film over a substrate which is separately prepared. Alternatively, only the signal line driver circuits or part thereof, or only the scan line driver circuits or part thereof may be separately formed and mounted. This embodiment is not limited to the structure illustrated in FIGS. 6A and 6B.

Through the above process, a highly reliable light-emitting display device (display panel) can be manufactured as a semiconductor device.

(Embodiment 6)

Figure 7A:
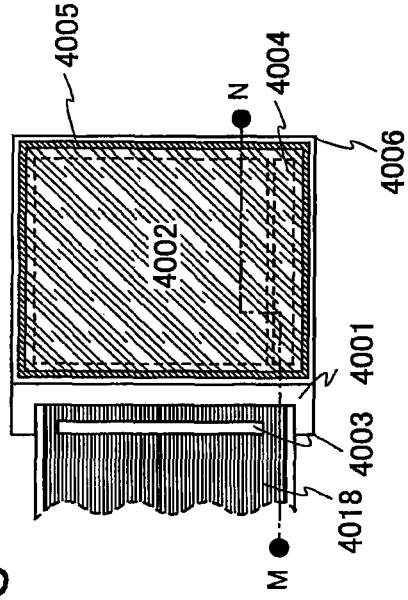
FIGS. 7A and 7C are top views and FIG. 7B is a cross-sectional view illustrating a display device according to an embodiment of the present invention.
Figure 7C:
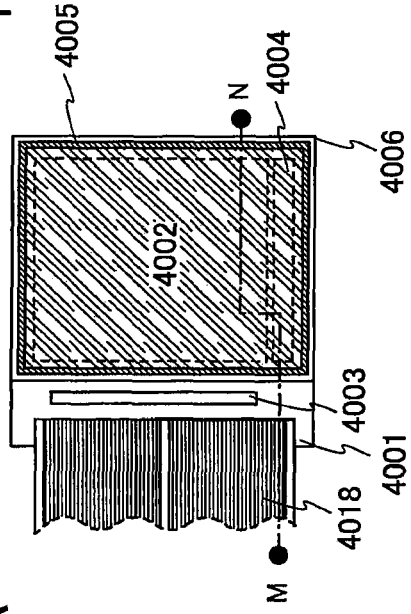
Figure 7B:
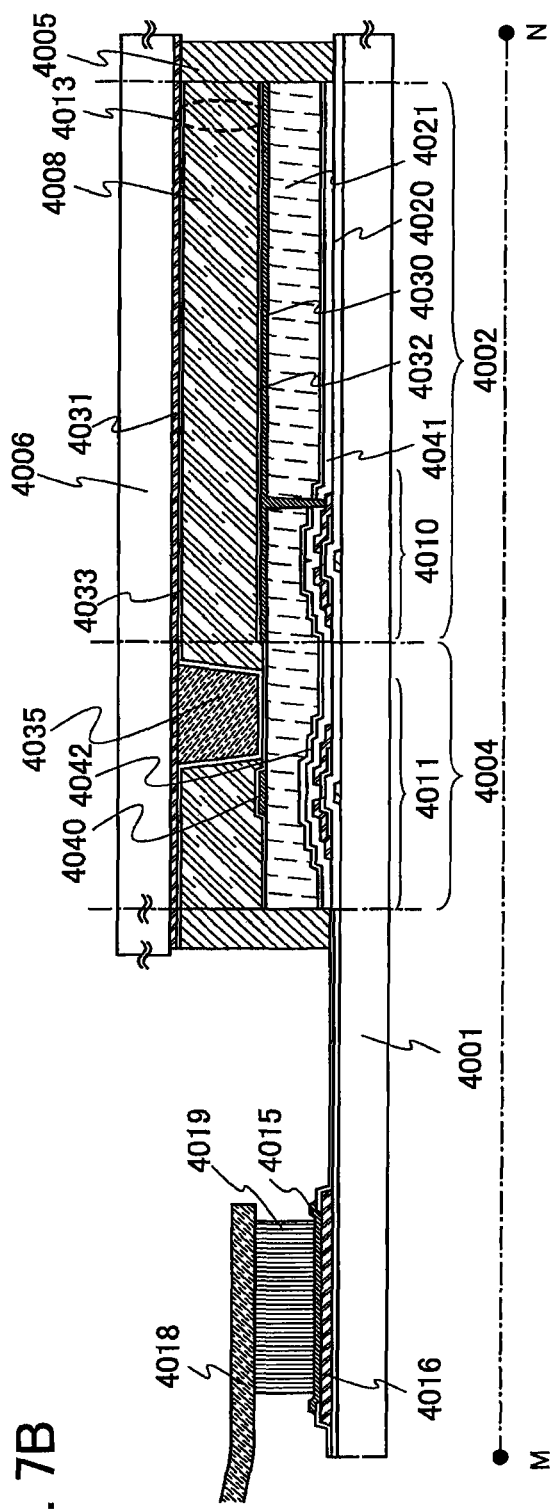

The appearance and the cross section of a liquid crystal display panel, which is an embodiment of a semiconductor device, will be described with reference to FIGS. 7A to 7C. FIGS. 7A and 7C are plan views of panels in each of which thin film transistors 4010 and 4011 and a liquid crystal element 4013 are sealed between a first substrate 4001 and a second substrate 4006 with a sealant 4005. FIG. 7B is a cross-sectional view taken along line M-N in FIGS. 7A and 7C.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that a connection method of a driver circuit which is separately formed is not limited to a particular method, and a COG method, a wire bonding method, a TAB method, or the like can be used. FIG. 7A illustrates an example of mounting the signal line driver circuit 4003 by a COG method, and FIG. 7C illustrates an example of mounting the signal line driver circuit 4003 by a TAB method.

The pixel portion 4002 and the scan line driver circuit 4004 provided over the first substrate 4001 each include a plurality of thin film transistors. FIG. 7B illustrates, as an example, the thin film transistor 4010 included in the pixel portion 4002 and the thin film transistor 4011 included in the scan line driver circuit 4004. Insulating layers 4041, 4042, and 4021 are provided over the thin film transistors 4010 and 4011.

Any of the highly reliable thin film transistors including the oxide semiconductor layers which are described in Embodiments 1 to 3 can be used as the thin film transistors 4010 and 4011. Any of the thin film transistors 410, 460, and 310 which are described in Embodiments 1 to 3 can be used as the thin film transistor 4011 for a driver circuit and the thin film transistor 4010 for a pixel. In this embodiment, the thin film transistors 4010 and 4011 are n-channel thin film transistors.

A conductive layer 4040 is provided over part of the insulating layer 4021, which overlaps with a channel formation region of an oxide semiconductor layer in the thin film transistor 4011 for the driver circuit. The conductive layer 4040 is provided at the position overlapping with the channel formation region of the oxide semiconductor layer, whereby the amount of change in threshold voltage of the thin film transistor 4011 before and after the BT test can be reduced. A potential of the conductive layer 4040 may be the same as or different from that of a gate electrode layer of the thin film transistor 4011. The conductive layer 4040 can also function as a second gate electrode layer. In addition, the potential of the conductive layer 4040 may be GND or 0 V, or the conductive layer 4040 may be placed in a floating state.

A pixel electrode layer 4030 included in the liquid crystal element 4013 is electrically connected to the thin film transistor 4010. A counter electrode layer 4031 of the liquid crystal element 4013 is provided on the second substrate 4006. A portion where the pixel electrode layer 4030, the counter electrode layer 4031, and the liquid crystal layer 4008 overlap with each other corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 therebetween.

Note that a light-transmitting substrate can be used as the first substrate 4001 and the second substrate 4006; glass, ceramics, or plastics can be used. As plastics, a fiberglass-reinforced plastic (FRP) plate, a polyvinyl fluoride (PVF) film, a polyester film, or an acrylic resin film can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may be used. In addition, the counter electrode layer 4031 is electrically connected to a common potential line formed over the same substrate as the thin film transistor 4010. With the use of a common connection portion, the counter electrode layer 4031 and the common potential line can be electrically connected to each other by conductive particles arranged between a pair of the substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase when the temperature of cholesteric liquid crystal is increased. Since the blue phase is generated only within a narrow range of temperature, a liquid crystal composition containing a chiral agent at greater than or equal to 5 wt % so as to widen the temperature range is used for the liquid crystal layer 4008. The liquid crystal composition which contains liquid crystal exhibiting a blue phase and a chiral agent has a short response time of less than or equal to 1 msec, has optical isotropy, which makes the alignment process unneeded, and has small viewing angle dependence.

An embodiment of the present invention can be applied to a semi-transmissive liquid crystal display device in addition to a transmissive liquid crystal display device.

An example of the liquid crystal display device is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. Moreover, the layered structure of the polarizing plate and the coloring layer is not limited to that in this embodiment and may be set as appropriate depending on materials of the polarizing plate and the coloring layer or conditions of the manufacturing process. Further, a light-blocking film serving as a black matrix may be provided in a portion other than the display portion.

Over the thin film transistors 4011 and 4010, the insulating layer 4041 is formed in contact with the oxide semiconductor layers. The insulating layer 4041 can be formed using a material and a method which are similar to those of the oxide insulating layer 416 described in Embodiment 1. Here, as the insulating layer 4041, a silicon oxide film is formed by a sputtering method. Further, the protective insulating layer 4042 is formed on and in contact with the insulating layer 4041. The protective insulating layer 4042 is an insulating layer formed of silicon oxide containing a boron element like the protective insulating layer 403 described in Embodiment 1. In order to reduce the surface roughness caused by the thin film transistors, the insulating layer 4021 serving as a planarization insulating film is formed over the protective insulating layer 4042.

As the insulating layer 4021, an organic material having heat resistance such as polyimide, acrylic, benzocyclobutene, polyamide, or epoxy can be used. Other than such organic materials, it is possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

There is no particular limitation on the method for forming the insulating layer 4021. The insulating layer 4021 can be formed, depending on the material, by a method such as a sputtering method, an SOG method, a spin coating method, a dipping method, a spray coating method, or a droplet discharge method (e.g., an ink-jet method, screen printing, or offset printing), or a tool (equipment) such as a doctor knife, a roll coater, a curtain coater, or a knife coater. A baking step of the insulating layer 4021 also serves as annealing of the semiconductor layer, whereby a semiconductor device can be manufactured efficiently.

The pixel electrode layer 4030 and the counter electrode layer 4031 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

A conductive composition containing a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule contained in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

A connection terminal electrode 4015 is formed from the same conductive film as the pixel electrode layer 4030 included in the liquid crystal element 4013, and a terminal electrode 4016 is formed from the same conductive film as source and drain electrode layers of the thin film transistors 4010 and 4011.

The connection terminal electrode 4015 is electrically connected to a terminal included in the FPC 4018 via an anisotropic conductive film 4019.

Note that FIGS. 7A to 7C illustrate an example in which the signal line driver circuit 4003 is formed separately and mounted on the first substrate 4001; however, the present invention is not limited to this structure. The scan line driver circuit may be separately formed and then mounted, or only part of the signal line driver circuit or part of the scan line driver circuit may be separately formed and then mounted.

Further, for the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

An example of a VA liquid crystal display device is described below.

The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. In this embodiment, in particular, a pixel is divided into some regions (subpixels), and molecules are aligned in different directions in their respective regions. This is referred to as multi-domain or multi-domain design. Hereinafter, a liquid crystal display device of multi-domain design is described.

Figure 8:
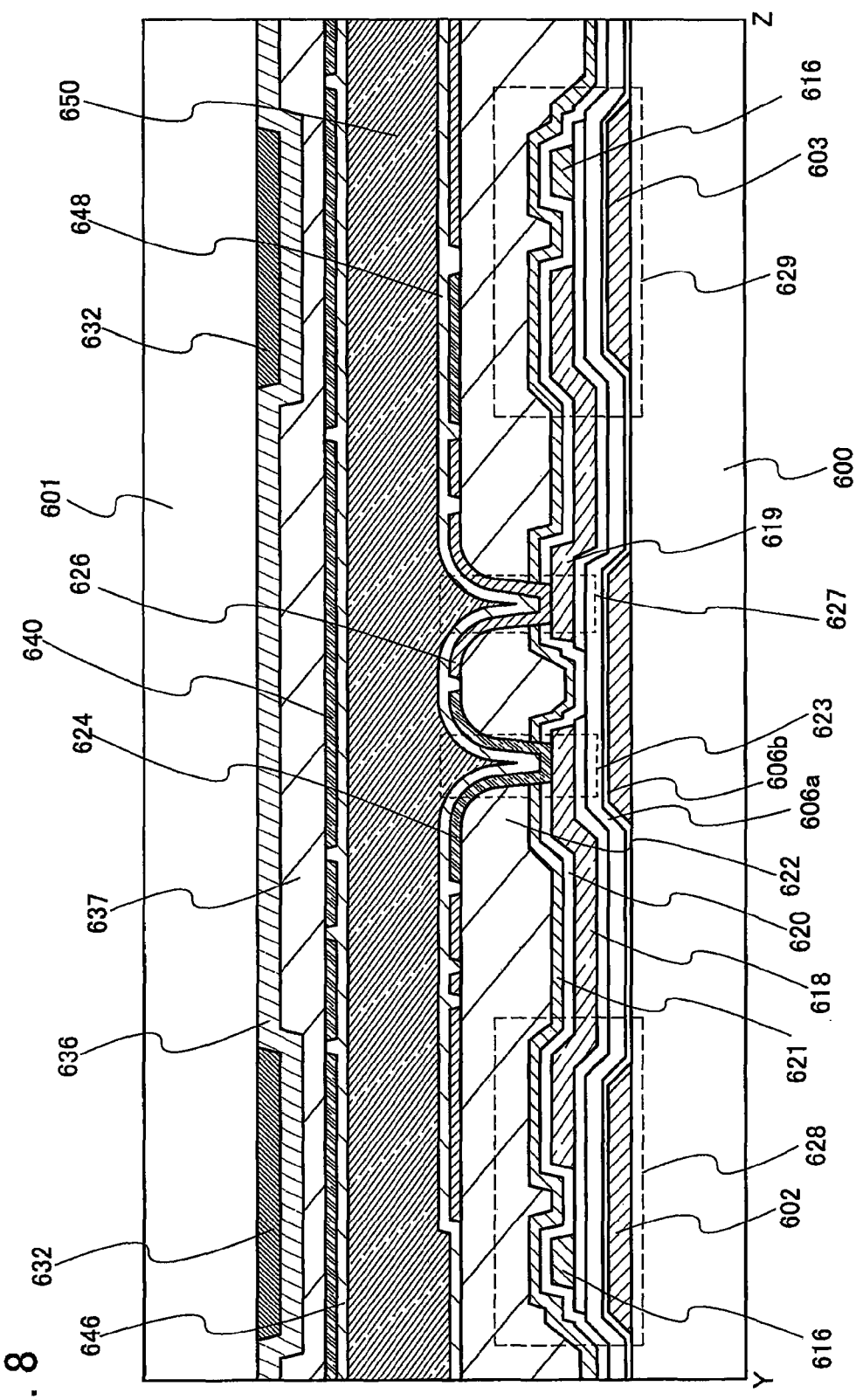
FIG. 8 is a cross-sectional view illustrating an embodiment of the present invention.
Figure 9:
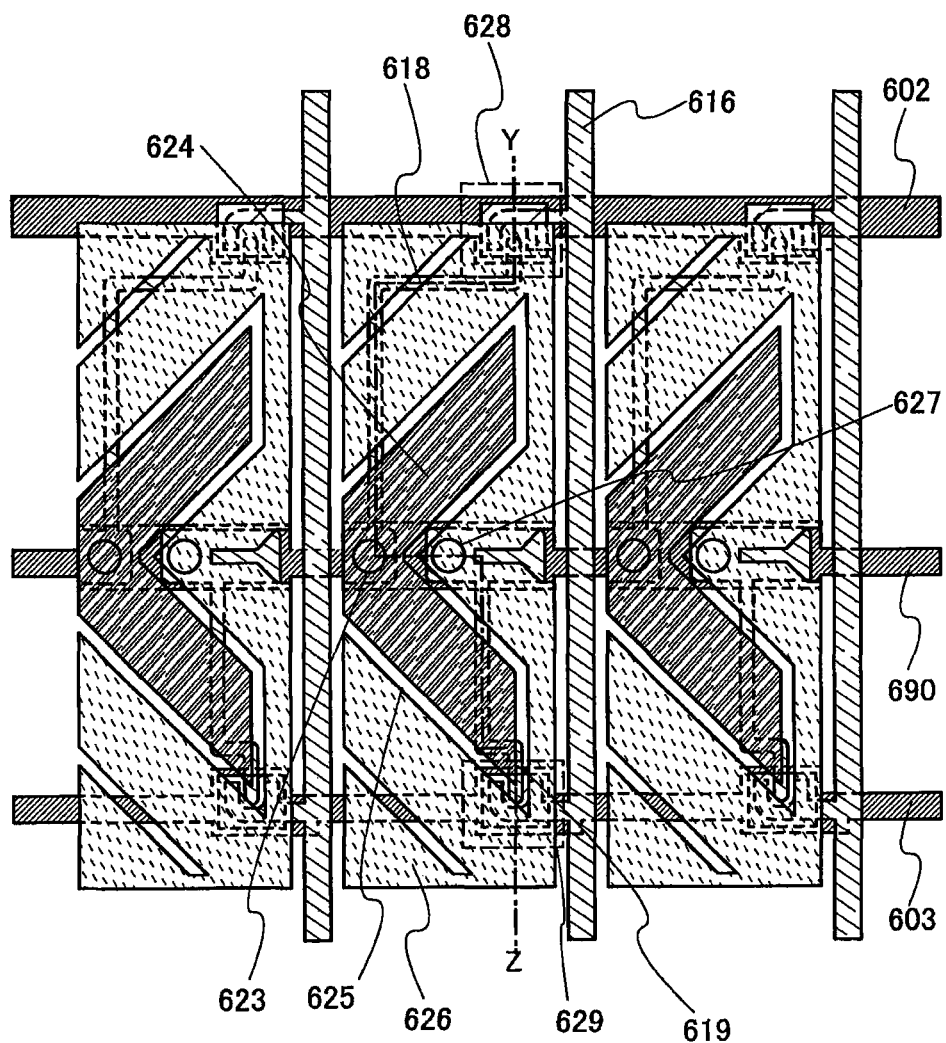
FIG. 9 is a top view illustrating an embodiment of the present invention.

FIG. 8 and FIG. 9 illustrate a pixel structure of a VA liquid crystal display panel. FIG. 9 is a plane view of a substrate 600. FIG. 8 illustrates a cross-sectional structure along line Y-Z in FIG. 9. Description below will be given with reference to both the drawings.

In this pixel structure, a plurality of pixel electrodes are provided in one pixel, and a TFT is connected to each pixel electrode. The plurality of TFTs are constructed so as to be driven by different gate signals. That is, signals that are applied to individual pixel electrodes in a multi-domain pixel are controlled independently of each other.

Via a contact hole 623, a pixel electrode 624 is connected to a TFT 628 through a wiring 618. Further, via a contact hole 627 formed in an insulating layer 620, a protective insulating layer 621 which covers the insulating layer 620, and an insulating layer 622 which covers the protective insulating layer 621, a pixel electrode 626 is connected to a TFT 629 through a wiring 619. A gate wiring 602 of the TFT 628 is separated from a gate wiring 603 of the TFT 629 so that different gate signals can be supplied to these gate wirings. On the other hand, a wiring 616 serving as a data line is shared by the TFTs 628 and 629. The thin film transistor described in any of Embodiments 1 to 3 can be used as the TFTs 628 and 629 as appropriate.

A first gate insulating layer 606a of the thin film transistor is a silicon oxide film containing a boron element obtained by a sputtering method and a second gate insulating layer 606b is a silicon oxide film obtained by a PCVD method. The insulating layer 620 which is in contact with the wiring 618 and the oxide semiconductor layer is a silicon oxide film obtained by a sputtering method, and the protective insulating layer 621 provided thereover is a silicon oxide film containing a boron element obtained by a sputtering method. Via the contact hole 623 formed in the insulating layer 620, the protective insulating layer 621 which covers the insulating layer 620, and the insulating layer 622 which covers the protective insulating layer 621, the pixel electrode 624 is electrically connected to the wiring 618.

Further, a storage capacitor is formed using a capacitor wiring 690, a stacked layer of the first gate insulating layer 606a and the second gate insulating layer 606b as a dielectric, and the pixel electrode or a capacitor electrode electrically connected to the pixel electrode.

Figure 11:
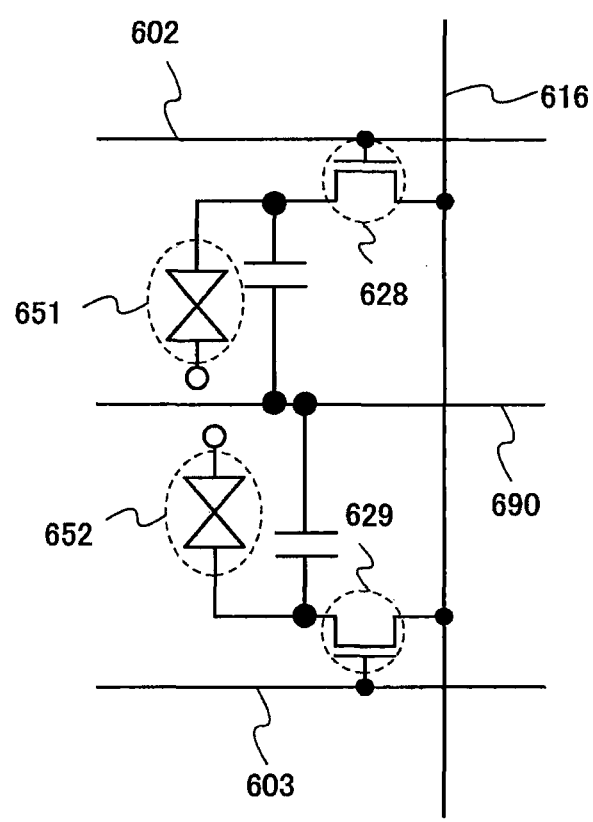
FIG. 11 is an equivalent circuit diagram illustrating a pixel according to an embodiment of the present invention.

The shape of the pixel electrode 624 is different from that of the pixel electrode 626, and the pixel electrodes are separated by slits 625. The pixel electrode 626 surrounds the pixel electrode 624 which has a V-shape. The TFTs 628 and 629 make the timing of applying voltages to the pixel electrodes 624 and 626 different from each other, thereby controlling alignment of liquid crystals. FIG. 11 shows an equivalent circuit of this pixel structure. The TFT 628 is connected to the gate wiring 602, and the TFT 629 is connected to the gate wiring 603. If different gate signals are supplied to the gate wirings 602 and 603, operation timing of the TFTs 628 and 629 can be different.

Figure 10:
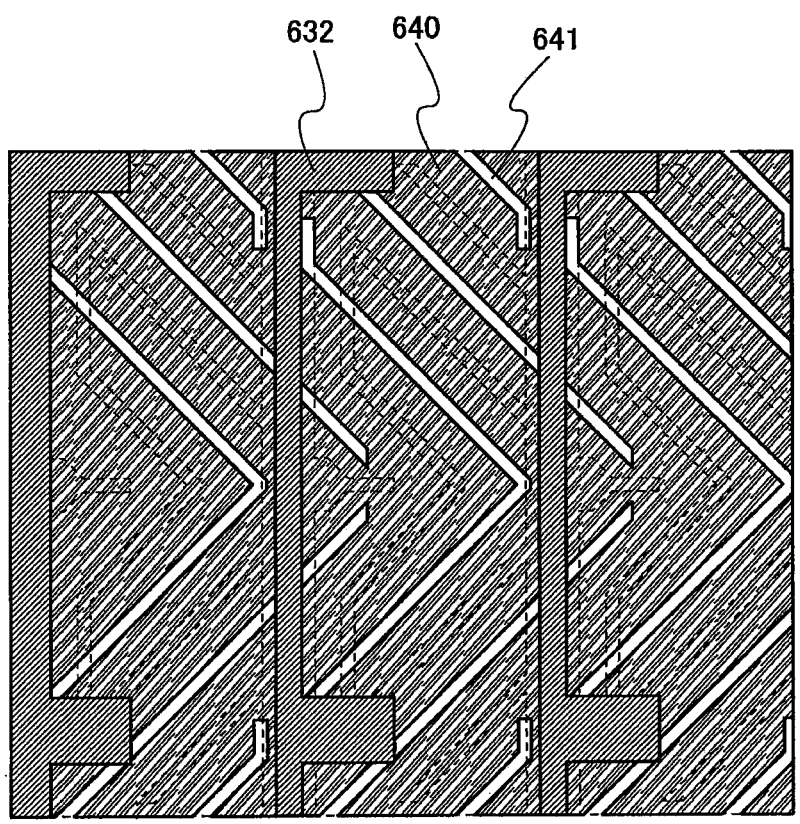
FIG. 10 is a top view illustrating an embodiment of the present invention.

A counter substrate 601 is provided with a light blocking film 632, a coloring film 636, and a counter electrode 640. In addition, a planarization film 637 which is also referred to as an overcoat film is formed between the coloring film 636 and the counter electrode 640 to prevent alignment disorder of liquid crystals. FIG. 10 illustrates a structure of the counter substrate side. The counter electrode 640 is shared by plural pixels, and slits 641 are formed in the counter electrode 640. The slits 641 and the slits on the pixel electrode layers 624 and 626 side are alternately arranged so that an oblique electric field is effectively generated, whereby the alignment of the liquid crystals can be controlled. Accordingly, the alignment of the liquid crystals can be varied in different places, so that the viewing angle is widened.

The pixel electrode 624, a liquid crystal layer 650, and the counter electrode 640 overlap with each other, so that a first liquid crystal element is formed. Further, the pixel electrode 626, the liquid crystal layer 650, and the counter electrode 640 overlap with each other, so that a second liquid crystal element is formed. The multi-domain structure is employed in which the first liquid crystal element and the second liquid crystal element are provided for one pixel.

This embodiment can be implemented in appropriate combination with the structure described in any of Embodiments 1 to 3.

(Embodiment 7)

In this embodiment, an example of an electronic paper will be described as a semiconductor device of an embodiment of the present invention.

Figure 12:
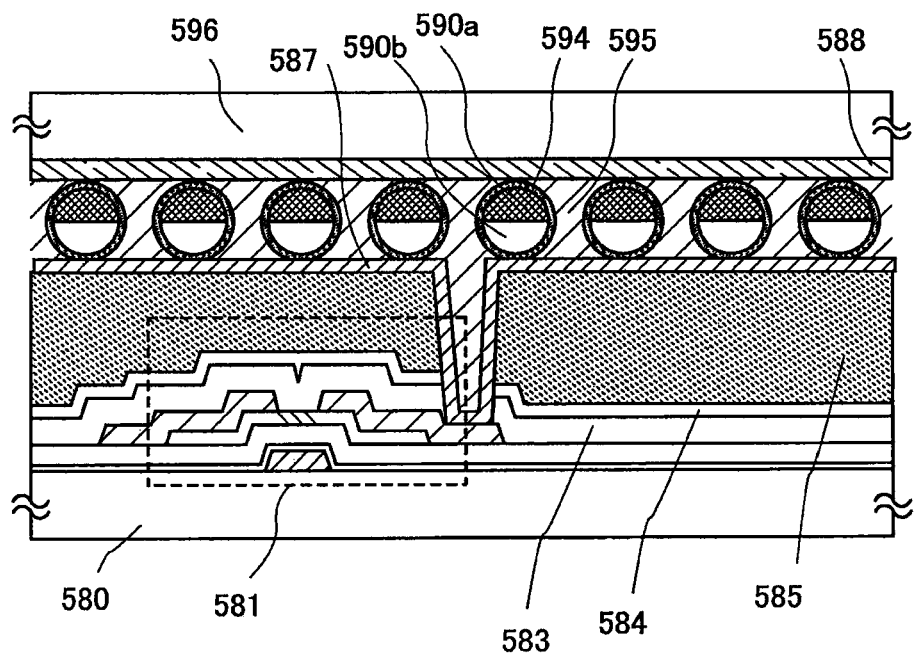
FIG. 12 is a cross-sectional view illustrating an embodiment of the present invention.

FIG. 12 illustrates an active matrix electronic paper as an example of a semiconductor device to which an embodiment of the present invention is applied. A thin film transistor 581 used for the semiconductor device can be manufactured in a manner similar to that of the thin film transistor 410 described in Embodiment 1 and is a thin film transistor with high electric characteristics including an oxide semiconductor layer covered with a protective insulating layer 584 formed of silicon oxide containing a boron element.

The electronic paper in FIG. 12 is an example of a display device using a twisting ball display system. The twisting ball display system refers to a method in which spherical particles each colored in black and white are used for a display element and arranged between a first electrode layer and a second electrode layer which are electrode layers, and a potential difference is generated between the first electrode layer and the second electrode layer to control orientation of the spherical particles, so that display is performed.

The thin film transistor 581 formed over a substrate 580 has a bottom-gate structure in which source and drain electrode layers are electrically connected to a first electrode layer 587 via an opening formed in an oxide insulating layer 583, the protective insulating layer 584 and an insulating layer 585. Between the first electrode layer 587 and a second electrode layer 588, spherical particles are provided. Each spherical particle includes a black region 590a and a white region 590b, and a cavity 594 filled with liquid around the black region 590a and the white region 590b. The circumference of the spherical particles is filled with a filler 595 such as a resin (see FIG. 12). In this embodiment, the first electrode layer 587 corresponds to a pixel electrode and the second electrode layer 588 provided on a counter substrate 596 corresponds to a common electrode.

Further, instead of the twisting ball, an electrophoretic element can be used.

A microcapsule having a diameter of about 10 µm to 200 µm in which transparent liquid, positively charged white microparticles, and negatively charged black microparticles are encapsulated, is used. In the microcapsule provided between the first electrode layer and the second electrode layer, when an electric field is applied by the first electrode layer and the second electrode layer, the white microparticles and the black microparticles move in opposite directions to each other, so that white or black can be displayed. A display element using this principle is an electrophoretic display element and is generally called an electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, a highly reliable electronic paper as a semiconductor device can be manufactured.

This embodiment can be implemented in appropriate combination with the thin film transistor described in any one of Embodiments 1 to 3.

(Embodiment 8)

In this embodiment, an example in which an insulated-gate semiconductor device, in particular, a semiconductor device called a power MOS device is formed is described. In general, a power MOS device means a semiconductor device (a semiconductor element) used as a switching element of an electronic device or the like. High-speed MOS power devices such as a power MOS FET and an IGBT are known.

Instead of the thin film transistor described in any of Embodiments 1 to 3, a transistor having a much thicker oxide semiconductor layer is manufactured, and thereby a power MOS device is formed. Further, a silicon oxide film containing a boron element is used as one layer of a gate insulating layer which is a stacked layer.

The power MOS device thus formed is used for controlling an inverter of lighting, as part of an integrated circuit incorporated in the lighting, for example. Besides, the power MOS device may be used for products in various fields such as a vehicle control system and a vehicle body device for an automobile, a television, a camera, a power supply for a computer, an air conditioner, and a programmable logic controller.
(Embodiment 9)

A semiconductor device disclosed in this specification can be applied to a variety of electronic devices (including amusement machines). Examples of the electronic devices are a television set (also referred to as a television or a television receiver), a monitor of a computer or the like, a camera such as a digital camera or a digital video camera, a digital photo frame, a mobile phone (also referred to as a mobile telephone or a mobile phone device), a portable game console, a portable information terminal, an audio reproducing device, a large-sized game machine such as a pachinko machine, and the like.

Figure 13A:
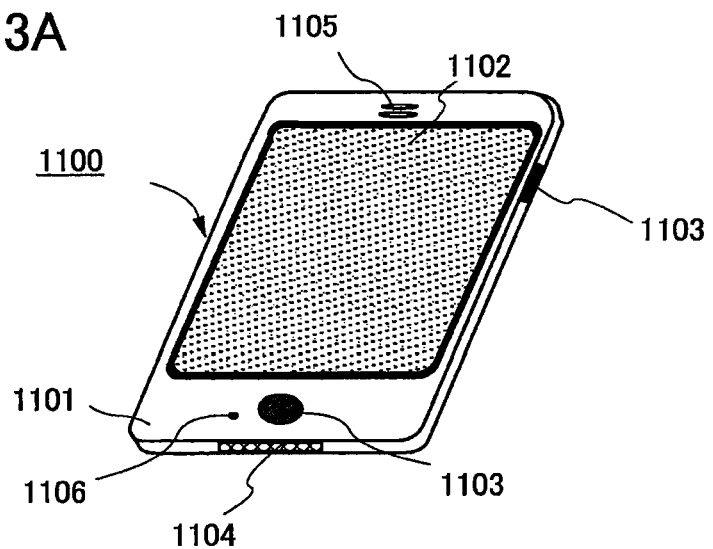
FIGS. 13A and 13B are views each illustrating an example of an electronic device.

FIG. 13A illustrates an example of a mobile phone. A mobile phone 1100 is provided with an operation button 1103, an external connection port 1104, a speaker 1105, a microphone 1106, and the like, in addition to a display portion 1102 incorporated in a housing 1101.

Data can be input to the mobile phone 1100 illustrated in FIG. 13A by touching the display portion 1102 with a finger or the like. Further, operations such as making calls and composing mails can be performed by touching the display portion 1102 with a finger or the like.

There are mainly three screen modes of the display portion 1102. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1102 so that characters displayed on a screen can be input. In this case, it is preferable to display a keyboard or number buttons on almost the entire screen of the display portion 1102.

When a detection device including a sensor for detecting inclination, such as a gyroscope or an acceleration sensor, is provided inside the mobile phone 1100, display on the screen of the display portion 1102 can be automatically switched by determining the orientation of the mobile phone 1100 (whether the mobile phone 1100 is placed horizontally or vertically for a landscape mode or a portrait mode).

The screen mode is switched by touching the display portion 1102 or operating the operation button 1103 of the housing 1101. Alternatively, the screen modes may be switched depending on the kind of the image displayed on the display portion 1102. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1102 is not performed for a certain period while a signal detected by an optical sensor in the display portion 1102 is detected, the screen mode may be controlled so as to be changed from the input mode to the display mode.

The display portion 1102 may function as an image sensor. For example, an image of a palm print, a fingerprint, or the like is taken when the display portion 1102 is touched with a palm or a finger, whereby personal identification can be performed. Further, by providing a backlight or a sensing light source which emits a near-infrared light in the display portion, an image of a finger vein, a palm vein, or the like can be taken.

In the display portion 1102, a plurality of the thin film transistors 410 described in Embodiment 1 are provided as switching elements of pixels.

Figure 13B:
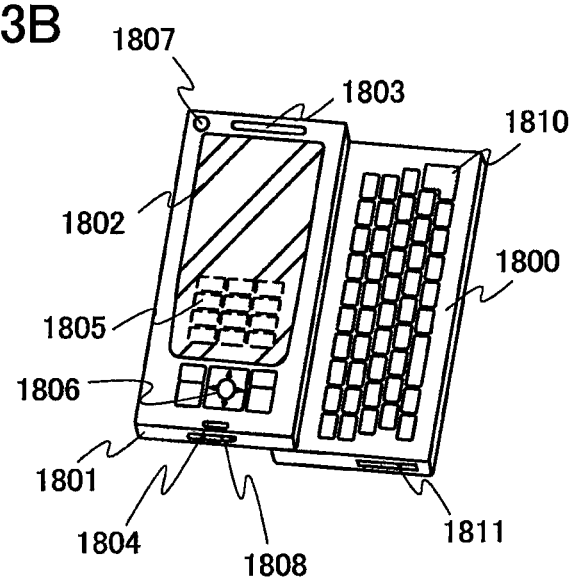

FIG. 13B illustrates an example of a portable information terminal. A portable information terminal whose example is illustrated in FIG. 13B can have a plurality of functions. For example, in addition to a telephone function, such a portable information terminal can have a function of processing a variety of pieces of data by incorporating a computer.

The portable information terminal illustrated in FIG. 13B has two housings, a housing 1800 and a housing 1801. The housing 1801 includes a display panel 1802, a speaker 1803, a microphone 1804, a pointing device 1806, a camera lens 1807, an external connection terminal 1808, and the like. The housing 1800 includes a keyboard 1810, an external memory slot 1811, and the like. In addition, an antenna is incorporated in the housing 1801.

The display panel 1802 is provided with a touch panel. A plurality of operation keys 1805 which are displayed as images are illustrated by dashed lines in FIG. 13B.

Further, in addition to the above structure, a contactless IC chip, a small memory device, or the like may be incorporated.

A light-emitting device can be used for the display panel 1802 and the direction of display is changed appropriately depending on the application mode. Further, the portable information terminal is provided with the camera lens 1807 on the same surface as the display panel 1802, and thus it can be used for videophone calls. The speaker 1803 and the microphone 1804 can be used for videophone calls, recording, and playing sound, etc. as well as voice calls. Moreover, the housings 1800 and 1801 in a state where they are developed as illustrated in FIG. 13B can shift so that one is lapped over the other by sliding; therefore, the size of the portable information terminal can be reduced, which makes the portable information terminal suitable for being carried.

The external connection terminal 1808 can be connected to an AC adapter and various types of cables such as a USB cable, and charging and data communication with a personal computer or the like are possible. Moreover, a storage medium can be inserted into the external memory slot 1811 so that a large amount of data can be stored and moved.

Further, in addition to the above functions, an infrared communication function, a television reception function, or the like may be provided.

Figure 14A:
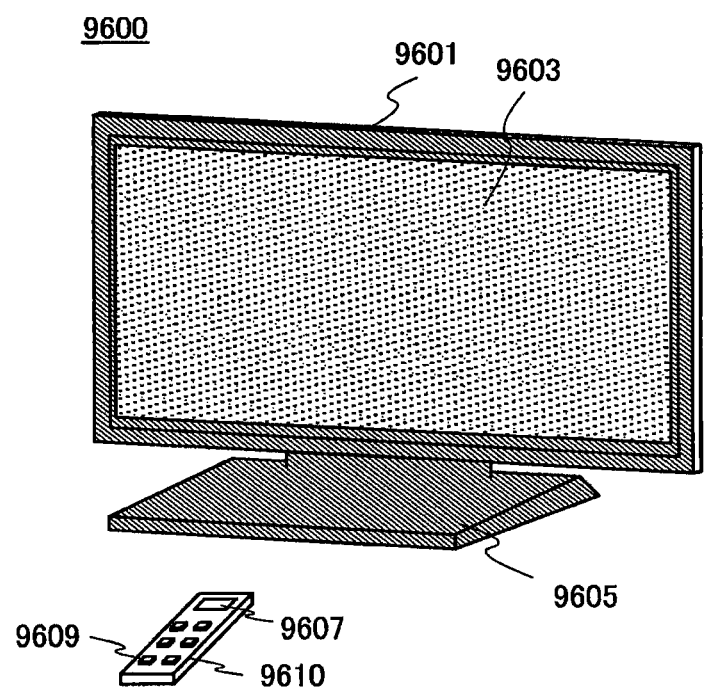
FIGS. 14A and 14B are views each illustrating an example of an electronic device.

FIG. 14A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) data communication can be performed.

In the display portion 9603, a plurality of the thin film transistors 410 described in Embodiment 1 are provided as switching elements of pixels.

Figure 14B:
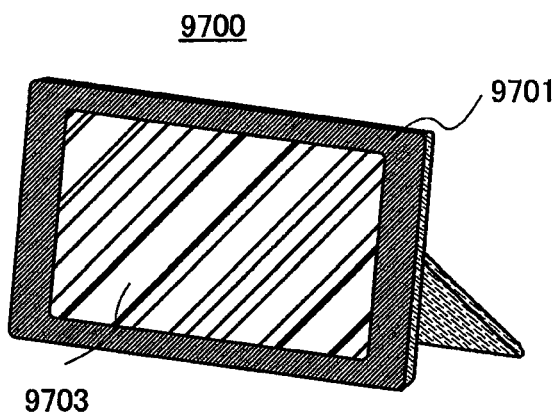

FIG. 14B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

In the display portion 9703, a plurality of the thin film transistors 410 described in Embodiment 1 are provided as switching elements of pixels.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted into the recording medium insertion portion of the digital photo frame, whereby the image data can be transferred and then displayed on the display portion 9703.

The digital photo frame 9700 may be configured to transmit and receive data wirelessly. e structure may be employed in which desired image data is transferred wirelessly to b displayed.

Figure 15:
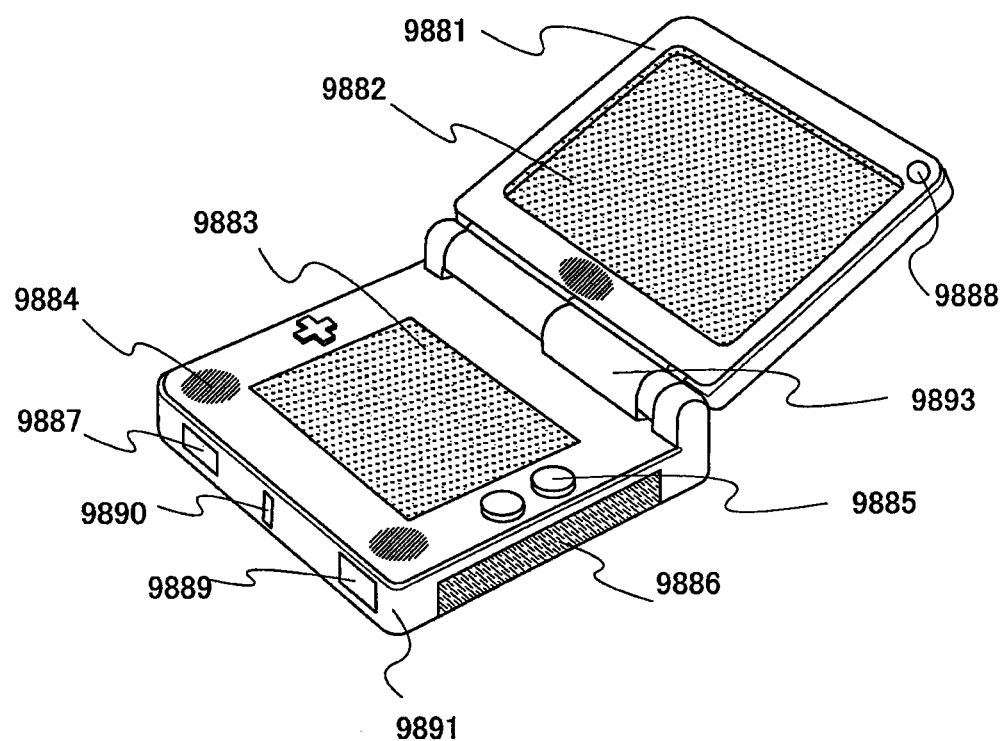
FIG. 15 is a view illustrating an example of an electronic device.

FIG. 15 illustrates a portable amusement machine including two housings, a housing 9881 and a housing 9891 which are jointed with a connector 9893 so as to be able to open and close. A display portion 9882 and a display portion 9883 are incorporated in the housing 9881 and the housing 9891, respectively.

In the display portion 9883, a plurality of the thin film transistors 410 described in Embodiment 1 are provided as switching elements of pixels.

In addition, the portable amusement machine illustrated in FIG. 15 includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 9889), and the like. It is needless to say that the structure of the portable amusement machine is not limited to the above and other structures provided with at least a thin film transistor disclosed in this specification can be employed. The portable amusement machine may include other accessory equipment as appropriate. The portable amusement machine illustrated in FIG. 15 has a function of reading a program or data stored in a recording medium to display it on the display portion, and a function of sharing information with another portable amusement machine by wireless communication. Note that the portable amusement machine illustrated in FIG. 15 is not limited to having these functions, and can have various functions.

Figure 16:
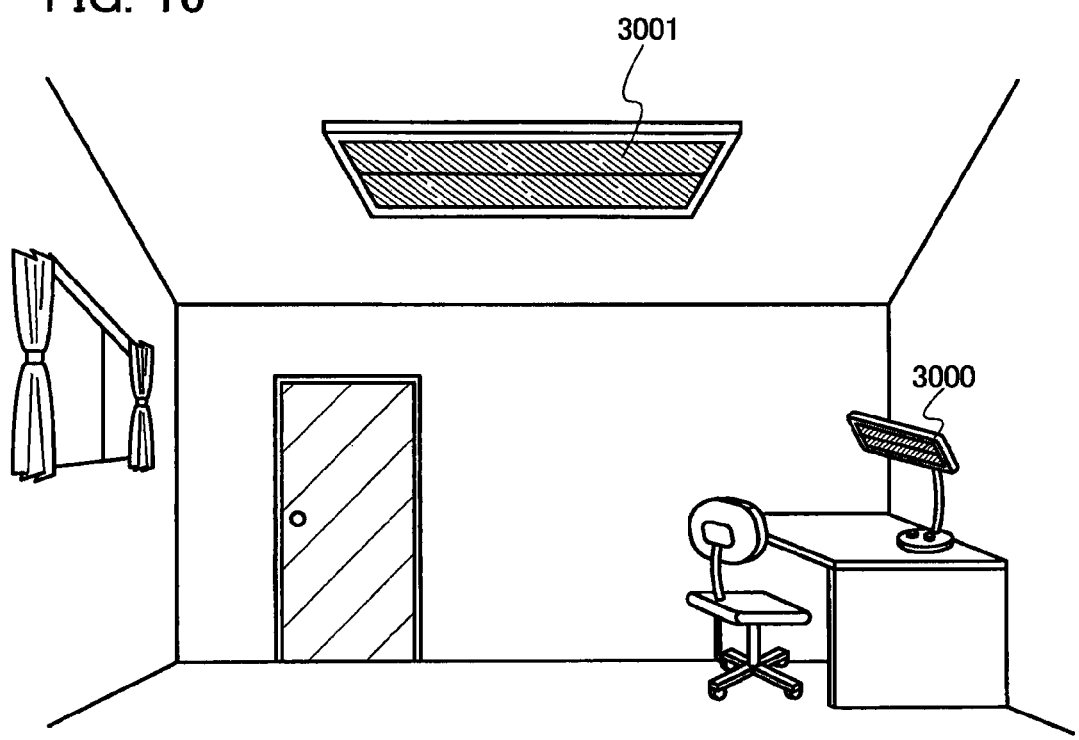
FIG. 16 is a view illustrating an example of an electronic device.

FIG. 16 is an example in which the light-emitting device formed in accordance with the above embodiments is used as an indoor lighting device 3001. Since the light-emitting device described in Embodiment 4 or 5 can be increased in area, the light-emitting device can be used as a lighting device having a large area. Further, the light-emitting device described in Embodiment 4 can be used as a desk lamp 3000. Note that a lighting device includes, in its category, a wall light, a light for an inside of a car, an evacuation light, and the like in addition to a ceiling light and a desk lamp.

In this manner, the thin film transistor described in any of Embodiments 1 to 3 can be provided in a display panel of a variety of electronic devices as described above. A highly reliable electronic device can be provided by using the thin film transistor 410 as a switching element of the display panel.

(Embodiment 10)

A semiconductor device disclosed in this specification can be applied to an electronic paper. The electronic paper can be used for electronic devices of a variety of fields as long as they can display data. For example, the electronic paper can be applied to an e-book reader (electronic book), a poster, an advertisement in a vehicle such as a train, or displays of various cards such as a credit card. An example of the electronic devices is illustrated in FIG. 17.

Figure 17:
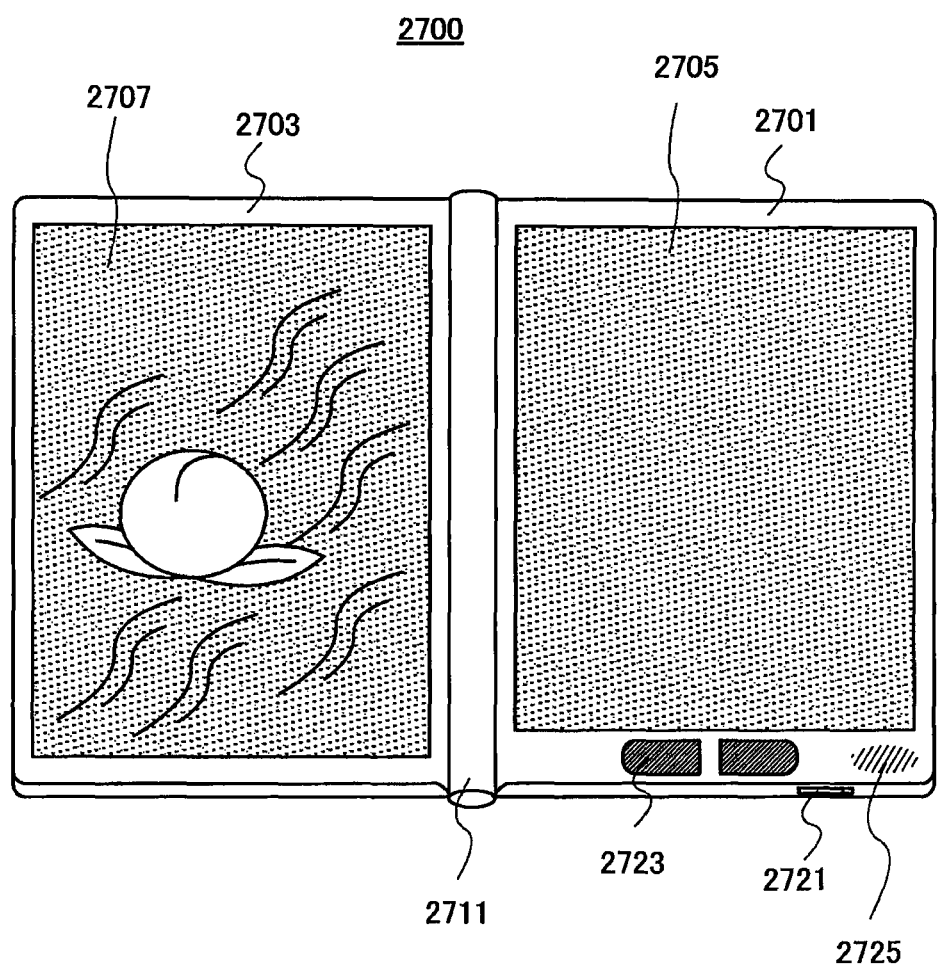
FIG. 17 is a view illustrating an example of an electronic device.

FIG. 17 illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 17) and graphics can be displayed on a display portion on the left side (the display portion 2707 in FIG. 17).

FIG. 17 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

This embodiment can be implemented in appropriate combination with the thin film transistor described in any one of Embodiments 1 to 3.

This application is based on Japanese Patent Application serial no. 2009-205222 filed with Japan Patent Office on Sep. 4, 2009, the entire contents of which are hereby incorporated by reference.

Explanation of Reference

300: substrate, 302*a*: gate insulating layer, 302*b*: gate insulating layer, 307: protective insulating layer, 310: thin film transistor, 311: gate electrode layer, 313*c*: channel formation region, 314*a*: oxide conductive layer, 314*b*: oxide conductive layer, 315a: source electrode layer, 315b: drain electrode layer, 316: oxide insulating layer, 330: oxide semiconductor film, 334: resist mask, 400: substrate, 402a: gate insulating layer, 402b: gate insulating layer, 403: protective insulating layer, 410: thin film transistor, 411: gate electrode layer, 413: channel formation region, 414a: high-resistance source region, 414b: high-resistance drain region, 415a: source electrode layer, 415b: drain electrode layer, 416: oxide insulating layer, 430: oxide semiconductor film, 431: oxide semiconductor layer, 450: substrate, 451: gate electrode layer, 452a: gate insulating layer, 452b: gate insulating layer, 453: oxide semiconductor layer, 454: channel formation region, 455a: source electrode layer, 455b: drain electrode layer, 456: oxide insulating layer, 457: protective insulating layer, 459: oxide semiconductor film, 460: thin film transistor, 580: substrate, 581: thin film transistor, 583: oxide insulating layer, 584: protective insulating layer, 585: insulating layer, 587: electrode layer, 588: electrode layer, 590a: black region, 590b: white region, 594: cavity, 595: filler, 596: counter substrate, 600: substrate, 601: counter substrate, 602: gate wiring, 603: gate wiring, 606a: gate insulating layer, 606b: gate insulating layer, 616: wiring, 618: wiring, 619: wiring, 620: insulating layer, 621: protective insulating layer, 622: insulating layer, 623: contact hole, 624: pixel electrode, 625: slit, 626: pixel electrode, 627: contact hole, 628: TFT, 629: TFT, 632: light-blocking film, 636: coloring film, 637: planarization film, 640: counter electrode, 641: slit, 650: liquid crystal layer, 690: capacitor wiring, 1100: mobile phone, 1101: housing, 1102: display portion, 1103: operation button, 1104: external connection port, 1105: speaker, 1106: microphone, 1800: housing, 1801: housing, 1802: display panel, 1803: speaker, 1804: microphone, 1805: operation key, 1806: pointing device, 1807: camera lens, 1808: external connection terminal, 1810: keyboard, 1811: external memory slot, 2700: e-book reader, 2701: housing, 2703: housing, 2705: display portion, 2707: display portion, 2711: hinge, 2721: power switch, 2723: operation key, 2725: speaker, 3000: desk lamp, 3001: lighting device, 4001: substrate, 4002: pixel portion, 4003: signal line driver circuit, 4004: scan line driver circuit, 4005: sealant, 4006: substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4021: insulating layer, 4030: pixel electrode layer, 4031: counter electrode layer, 4032: insulating layer, 4040: conductive layer, 4041: insulating layer, 4042: protective insulating layer, 4501: substrate, 4502: pixel portion, 4503a: signal line driver circuit, 4503b: signal line driver circuit, 4504a: scan line driver circuit, 4504b: scan line driver circuit, 4505: sealant, 4506: substrate, 4507: filler, 4509: thin film transistor, 4510: thin film transistor, 4511: light-emitting element, 4512: electroluminescent layer, 4513: second electrode, 4515: connection terminal electrode, 4516: terminal electrode, 4517: first electrode, 4518a: FPC, 4518b: FPC, 4519: anisotropic conductive film, 4520: partition, 4540: conductive layer, 4542: oxide insulating layer, 4543: overcoat layer, 4544: insulating layer, 4545: color filter layer, 4547: insulating layer, 6400: pixel, 6401: switching transistor, 6402: driver transistor, 6403: capacitor, 6404: light-emitting element, 6405: signal line, 6406: scan line, 6407: power supply line, 6408: common electrode, 7001: TFT, 7002: light-emitting element, 7003: electrode, 7004: EL layer, 7005: electrode, 7009: partition, 7011: driving TFT, 7012: light-emitting element, 7013: electrode, 7014: EL layer, 7015: electrode, 7016: light-blocking film, 7017: conductive film, 7019: partition, 7021: driving TFT, 7022: light-emitting element, 7023: electrode, 7024: EL layer, 7025: electrode, 7026: electrode, 7027: conductive film, 7029: partition, 7031: insulating layer, 7032: insulating layer, 7033: color filter layer, 7034: overcoat layer, 7035: protective insulating layer, 7041: insulating layer, 7042: insulating layer, 7043: color filter layer, 7044: overcoat layer, 7045: protective insulating layer, 7051: oxide insulating layer, 7052: protective insulating layer, 7053: planarization insulating layer, 7055: insulating layer, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: input means, 9886: recording medium insertion portion, 9887: connection terminal, 9888: sensor, 9889: microphone, 9890: LED lamp, 9891: housing, 9893: connector

The invention claimed is:

1. A semiconductor device comprising:
a first insulating layer over a substrate;
an oxide semiconductor layer over the first insulating layer; and
a second insulating layer over the oxide semiconductor layer,
wherein the first insulating layer and the second insulating layer each contain a boron at greater than or equal to $1 \times 10^{18}$ cm$^{-3}$ and less than or equal to $1 \times 10^{22}$ cm$^{-3}$.

2. The semiconductor device according to claim 1, wherein the second insulating layer is in contact with the oxide semiconductor layer.

3. The semiconductor device according to claim 1, further comprising a third insulating layer formed of silicon oxide between the second insulating layer and the oxide semiconductor layer.

4. The semiconductor device according to claim 1, wherein the first insulating layer and the second insulating layer are each formed of silicon oxide.

5. A semiconductor device comprising:
a first insulating layer over a substrate;
an oxide semiconductor layer over the first insulating layer; and
a second insulating layer over the oxide semiconductor layer,
wherein the first insulating layer and the second insulating layer each contain a phosphorus element at greater than or equal to $1 \times 10^{19}$ cm$^{-3}$ and less than or equal to $3 \times 10^{21}$ cm$^{-3}$.

6. The semiconductor device according to claim 5, wherein the second insulating layer is in contact with the oxide semiconductor layer.

7. The semiconductor device according to claim 5, further comprising a third insulating layer formed of silicon oxide between the second insulating layer and the oxide semiconductor layer.

8. The semiconductor device according to claim 5, wherein the first insulating layer and the second insulating layer are each formed of silicon oxide.

9. A semiconductor device comprising:
a first insulating layer over a substrate;
an oxide semiconductor layer on and in contact with the first insulating layer; and
a second insulating layer on and in contact with the oxide semiconductor layer,
wherein the first insulating layer and the second insulating layer each contain a boron element at greater than or equal to $1 \times 10^{18}$ cm$^{-3}$ and less than or equal to $1 \times 10^{22}$ cm$^{-3}$.

10. The semiconductor device according to claim 9, wherein the second insulating layer is in contact with the oxide semiconductor layer.

11. The semiconductor device according to claim 9, further comprising a third insulating layer formed of silicon oxide between the second insulating layer and the oxide semiconductor layer.

12. The semiconductor device according to claim 9, wherein the first insulating layer and the second insulating layer are each formed of silicon oxide.

13. A semiconductor device comprising:
a first insulating layer over a substrate;
an oxide semiconductor layer on and in contact with the first insulating layer; and
a second insulating layer on and in contact with the oxide semiconductor layer,
wherein the first insulating layer and the second insulating layer each contain an aluminum element at greater than or equal to $1\times10^{18}$ cm$^{-3}$ and less than or equal to $1\times10^{22}$ cm$^{-3}$.

14. The semiconductor device according to claim 13, wherein the second insulating layer is in contact with the oxide semiconductor layer.

15. The semiconductor device according to claim 13, further comprising a third insulating layer formed of silicon oxide between the second insulating layer and the oxide semiconductor layer.

16. The semiconductor device according to claim 13, wherein the first insulating layer and the second insulating layer are each formed of silicon oxide.

17. A semiconductor device comprising:
a first insulating layer over a substrate;
an oxide semiconductor layer over the first insulating layer; and
a second insulating layer over the oxide semiconductor layer,
wherein the first insulating layer and the second insulating layer each contain an antimony element at greater than or equal to $1\times10^{19}$ cm$^{-3}$ and less than or equal to $3\times10^{21}$ cm$^{-3}$.

18. The semiconductor device according to claim 17, wherein the second insulating layer is in contact with the oxide semiconductor layer.

19. The semiconductor device according to claim 17, further comprising a third insulating layer formed of silicon oxide between the second insulating layer and the oxide semiconductor layer.

20. The semiconductor device according to claim 17, wherein the first insulating layer and the second insulating layer are each formed of silicon oxide.

* * * * *